US012719441B2

(12) United States Patent
Saarela et al.

(10) Patent No.: US 12,719,441 B2
(45) Date of Patent: Aug. 25, 2026

(54) TEMPERATURE-STABLE MEMS RESONATOR

(71) Applicant: KYOCERA Technologies Oy, Espoo (FI)

(72) Inventors: Ville Saarela, Espoo (FI); Matias Perttilä, Espoo (FI); Antti Jaakkola, Espoo (FI); Aarne Oja, Espoo (FI); Panu Koppinen, Espoo (FI); Antti Rautiainen, Espoo (FI)

(73) Assignee: KYOCERA Technologies Oy, Espoo (FI)

( * ) Notice: Subject to any disclaimer, the term of this patent is extended or adjusted under 35 U.S.C. 154(b) by 373 days.

(21) Appl. No.: 18/293,379

(22) PCT Filed: Sep. 1, 2022

(86) PCT No.: PCT/FI2022/050576
§ 371 (c)(1),
(2) Date: Jan. 30, 2024

(87) PCT Pub. No.: WO2023/031521
PCT Pub. Date: Mar. 9, 2023

(65) Prior Publication Data

US 2024/0339985 A1 Oct. 10, 2024

(30) Foreign Application Priority Data

Sep. 3, 2021 (FI) ..................................... 20215933

(51) Int. Cl.
*H03H 9/02* (2006.01)
*H03H 3/007* (2006.01)

(52) U.S. Cl.
CPC ...... *H03H 9/02448* (2013.01); *H03H 3/0076* (2013.01)

(58) Field of Classification Search
CPC ........................ H03H 9/02448; H03H 3/0076
USPC ................................................. 333/187, 219
See application file for complete search history.

(56) References Cited

U.S. PATENT DOCUMENTS

| | | | |
|---|---|---|---|
| 8,916,407 B1 | 12/2014 | Grosjean et al. |
| 9,559,660 B2 | 1/2017 | Pensala et al. |
| 10,476,477 B1 | 11/2019 | Grosjean et al. |
| 10,676,349 B1 | 6/2020 | Grosjean et al. |
| 2012/0286903 A1 | 11/2012 | Prunnila et al. |

(Continued)

FOREIGN PATENT DOCUMENTS

WO 2012/156585 A1 11/2012

OTHER PUBLICATIONS

Rajai Payman et al. Modeling of Nonlinear Dynamics and Temperature Stability of Doped Silicon Microresonators, IEEE Transactions on Electron Devices, vol. 68, No. 6, Jun. 2021, pp. 2957-2964.

*Primary Examiner* — Andrea Lindgren Baltzell
*Assistant Examiner* — Victor Cole
(74) *Attorney, Agent, or Firm* — Espatent Oy

(57) ABSTRACT

A MEMS (microelectromechanical system) resonator (150) comprising a substrate (105), a resonator element (100), and a cavity (110). The resonator element (100) is separated from the substrate (105) by said cavity (110), and the resonator element (100) comprises a layer of single-crystalline silicon (101). The layer of single-crystalline silicon (101) is doped with phosphorus atoms to obtain a specific doping profile.

17 Claims, 12 Drawing Sheets

(56) References Cited

U.S. PATENT DOCUMENTS

| | | | |
|---|---|---|---|
| 2016/0099704 A1 | 4/2016 | Jaakkola et al. | |
| 2017/0093361 A1 | 3/2017 | Grosjean et al. | |
| 2017/0230030 A1* | 8/2017 | Doll | H03H 3/0077 |
| 2020/0220549 A1* | 7/2020 | Oja | H03L 1/02 |

* cited by examiner

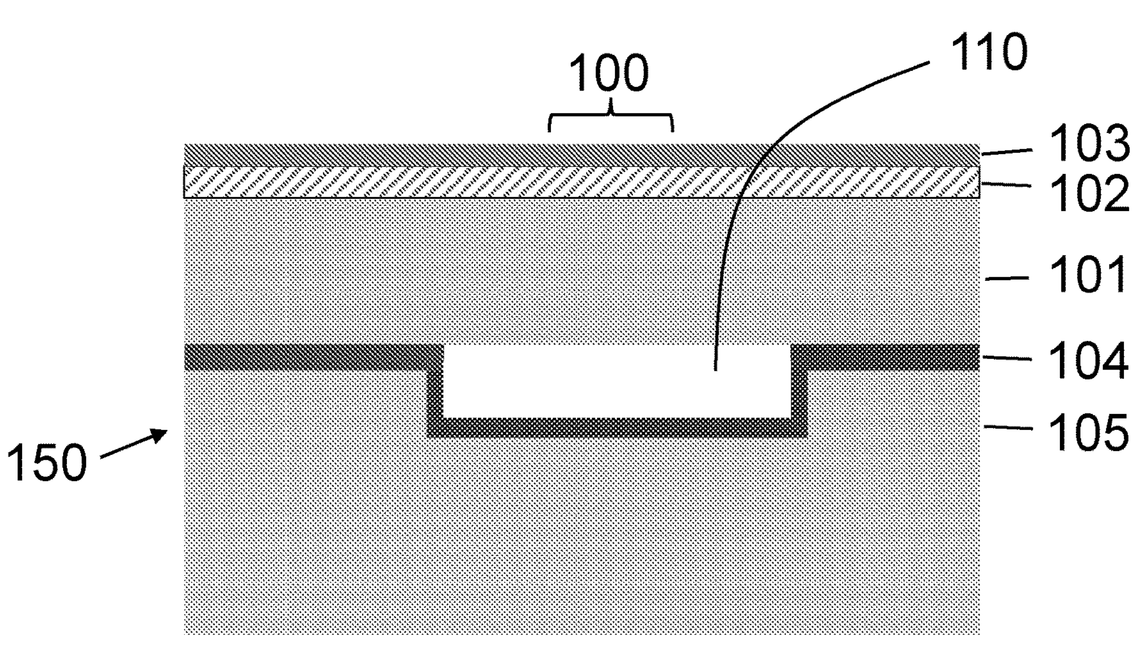
Fig. 1
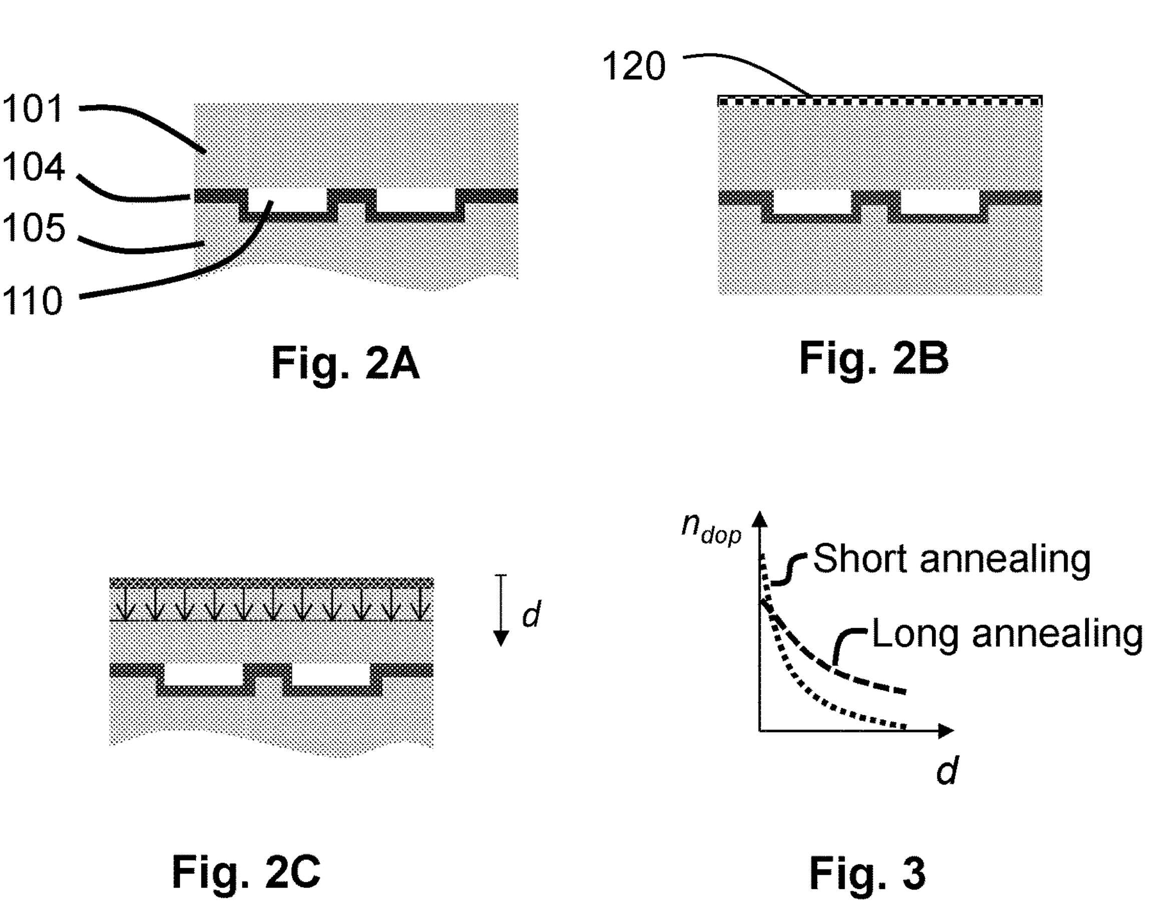
Fig. 2A
Fig. 2B
Fig. 2C
Fig. 3

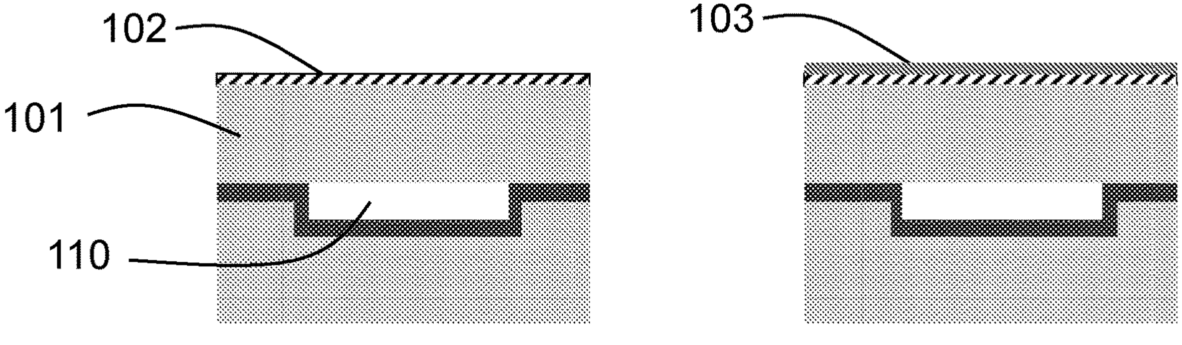
Fig. 4A
Fig. 4B
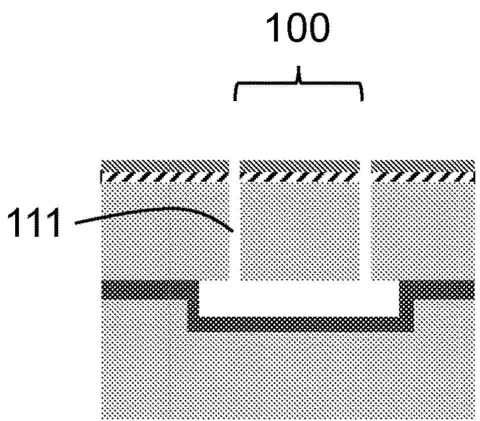
Fig. 4C

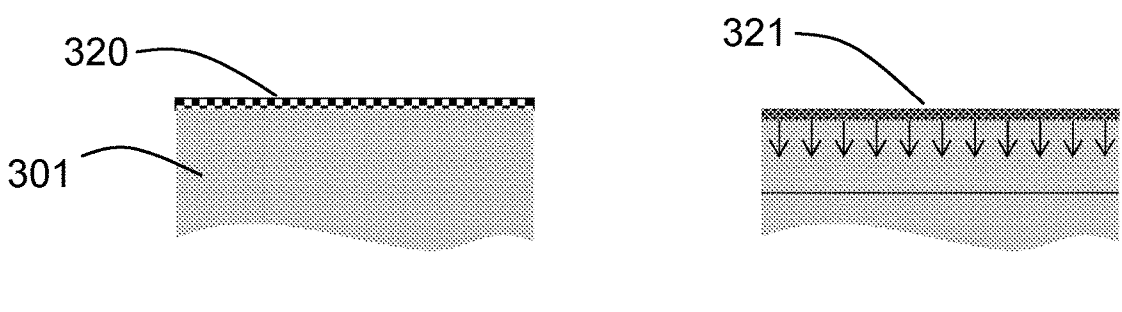
Fig. 7A
Fig. 7B
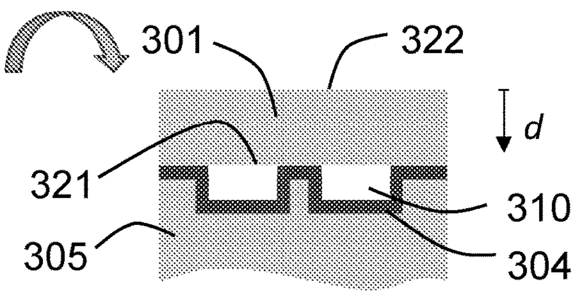
Fig. 7C
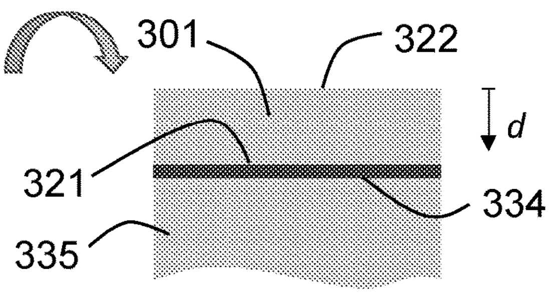
Fig. 7D
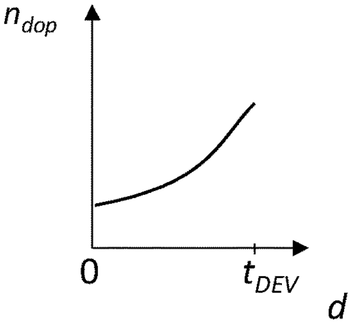
Fig. 8

150
621
630
632
100
622
632
803
102'
102
101
104
105
110

TEMPERATURE-STABLE MEMS RESONATOR

FIELD OF THE INVENTION

The present invention generally relates to microelectromechanical system, MEMS, resonators.

BACKGROUND OF THE INVENTION

This section illustrates useful background information without admission of any technique described herein representative of the state of the art.

Microelectromechanical system (MEMS) resonators are being developed to provide the same functionality as quartz resonators with benefits such as smaller chip size, reduced cost, and increased robustness against shocks and vibrations. Wafer processing technologies are used to manufacture MEMS resonators. Before dicing, a single MEMS resonator wafer may comprise several resonators, such as 10,000 . . . 500,000 resonators depending on the wafer size, resonator dimensions, and the layout. A key performance parameters of MEMS resonators such as silicon MEMS resonators used for frequency reference applications include low variation of the resonance frequency over the operation temperature range, low equivalent series resistance (ESR), and good long-term stability (low ageing) of the resonance frequency.

SUMMARY

It is an object of certain embodiments of the invention to provide a MEMS resonator with desired properties or at least to provide an alternative to existing technology.

A particular objective of certain embodiments is to reduce the variation of the resonance frequency over the operation temperature range.

According to a first example aspect of the invention there is provided a MEMS (microelectromechanical system) resonator comprising:

a substrate;

a resonator element; and a cavity, wherein the resonator element is separated from the substrate by said cavity, and wherein the resonator element comprises a layer of single-crystalline silicon, wherein the layer of single-crystalline silicon is doped with phosphorus atoms where the concentration $n_{dop}$ of the phosphorus atoms is (i) within the range from $1.99\times10^{20}$ $cm^{-3}$ to $2.97\times10^{20}$ $cm^{-3}$ at $d/t_{DEV}=0.1$ and within the range from $1.20\times10^{20}$ $cm^{-3}$ to $1.78\times10^{20}$ $cm^{-3}$ at $d/t_{DEV}=0.9$ or (ii) within the range from $1.20\times10^{20}$ $cm^{-3}$ to $1.80\times10^{20}$ $cm^{-3}$ at $d/t_{DEV}=0.1$ and within the range from $2.02\times10^{20}$ $cm^{-3}$ to $2.97\times10^{20}$ $cm^{-3}$ at $d/t_{DEV}=0.9$ or (iii) within the range from $2.08\times10^{20}$ $cm^{-3}$ to $2.97\times10^{20}$ $cm^{-3}$ at $d/t_{DEV}=0.1$, within the range from $1.20\times10^{20}$ $cm^{-3}$ to $1.86\times10^{20}$ $cm^{-3}$ at $d/t_{DEV}=0.5$, and within the range from $2.08\times10^{20}$ $cm^{-3}$ to $2.97\times10^{20}$ $cm^{-3}$ at $d/t_{DEV}=0.9$ where d is the distance between a position within the layer of single-crystalline silicon and the top surface of the layer of single-crystalline silicon and $t_{DEV}$ is the thickness of the layer of single-crystalline silicon.

In certain embodiments, the resonator or resonator element further comprises a layer of piezoelectric material for exciting the resonator element to a resonance mode.

In certain embodiments, the layer of piezoelectric material resides on top of the layer of single-crystalline silicon. In certain embodiments, the resonator element comprises a top electrode layer on top of the layer of piezoelectric material. In certain embodiments, the top electrode layer comprises phosphorus-doped single-crystalline silicon. In certain embodiments, the resonator element comprises a layer of phosphorus-doped single-crystalline silicon on both sides of the layer of piezoelectric material. The doping concentration in the top electrode layer may be any of the alternatives (i), (ii), and (iii).

The doping concentration and/or profile in the top electrode layer may be the same or different compared with the doping concentration and/or profile in the phosphorus-doped single-crystalline silicon layer at the other side of the piezoelectric layer.

In certain embodiments, the thickness of the layer of piezoelectric material is within the range from 0.5 μm to 3 μm, such as from 1 μm to 2 μm, for exciting the resonator element to the resonance mode.

In certain embodiments, the thickness of the layer of single-crystalline silicon is within the range from 2 μm to 40 μm, such as from 5 μm to 20 μm, or from 9 μm to 17 μm.

In certain embodiments, the phosphorus-doped single-crystalline silicon forms more than 50% of the mass of the resonator element.

In certain embodiments, the variation of the resonance frequency in the temperature range from −30° C. to 85° C. is within +30 parts per million with respect to the resonance frequency at the temperature 25° C.

In certain embodiments, the resonator element comprises an elongated material portion which is substantially parallel with a <100> crystalline axis of the layer of single-crystalline silicon within the plane of the layer of single-crystalline silicon.

In certain embodiments, the resonator element comprises an elongated material portion which is resonating in a length-extensional resonance mode or in a flexural resonance mode.

Embodiments of the invention are particularly useful for silicon MEMS resonators comprising a piezoelectric layer because the negative temperature coefficient associated with a piezoelectric layer makes it difficult to realize thermally stable silicon MEMS resonators. An advantageous thickness for the piezoelectric layer is in the range from 0.5 μm to 3 μm, such as from 1 μm to 2 μm considering for example ease of deposition of the piezoelectric layer by sputtering as well as avoidance of too-large electrical shunt capacitance across the piezoelectric layer which has the tendency to reduce figure of merit, FOM, of the MEMS resonator. With the piezoelectric layer of the thickness in the range from 0.5 μm to 3 μm, the thickness of the single-crystalline silicon layer is preferably in the range from 2 μm to 40 μm. More preferably, with the piezoelectric layer of the thickness in the range from 1 μm to 2 μm, the thickness of the single-crystalline silicon layer is in the range from 5 μm to 20 μm. Yet more preferably, with the piezoelectric layer of the thickness in the range from 1 μm to 2 μm, the thickness of the single-crystalline silicon layer is in the range in the range from 9 μm to 17 μm. The thickness of the doped single-crystalline silicon layer should be sufficiently large in comparison to the thickness of the piezoelectric layer to realize a thermally stable (compound) MEMS resonator with single-crystalline silicon and piezoelectric layers. The above-mentioned thicknesses of the single-crystalline silicon layer are not too large considering ease of high-aspect-ratio deep reactive etching of trenches through the material layers of the resonator element, or considering the strength of electromechanical coupling which decreases with the increasing thickness of the single-crystalline silicon layer. However, in certain embodiments, phosphorus doping of single-crystalline becomes difficult at the above-mentioned thicknesses of the single-crystalline silicon layer. The (average) phosphorus doping level of single-crystalline silicon needs to be large enough for thermal compensation but the local phosphorus doping level should not be too large to avoid, for example, precipitation of undesired compounds of silicon and phosphorus (such as SiP) and ensuing increase in process variation and decrease in yield, and to avoid excessively long high-temperature annealing. Phosphorus doping profile according to the invention solves these problems and results in thermally stable (compound) MEMS resonators with the variation of the resonance frequency in the temperature range from −30° C. to 85° C. being within ±30 parts per million (or even less such as within ±10 parts per million) with respect to the resonance frequency at the temperature 25° C. Phosphorus doping profile according to the invention is suited also for MEMS resonators formed in cavity-SOI wafers which are especially prone to stress-relaxation effects caused by excessive impurity doping near the surface of the single-crystalline silicon layer facing the cavity. In the exemplary embodiments, phosphorus impurity atoms are introduced to the single-crystalline silicon from a surface of the silicon wafer perpendicular to the wafer plane (the doping surface) and, therefore, the phosphorus dopant concentration varies only in the direction perpendicular to the wafer plane, i.e., as a function of the distance from the doping surface. As the thickness of the silicon device layer can be accurately controlled, for example, by using ion-beam trimming of silicon to reduce thickness variation of the silicon device layer, process variations (such as across-the-wafer variations in the frequency vs. temperature characteristics or variations in the value of the resonance frequency) can be maintained at a low level for MEMS resonators according to the invention. To further decrease variations in the frequency vs. temperature characteristics, the geometry of the resonator element, the resonance mode, and the direction of crystalline axes within the single-crystalline silicon layer may be designed concurrently with the phosphorus doping profile and the thicknesses of the single-crystalline silicon and piezoelectric layers.

In certain embodiments, the resonator element comprises a layer of single-crystalline silicon doped with phosphorus atoms and the concentration $n_{dop}$ of the phosphorus atoms is according to the equation (i) or (ii) or (iii) of the first aspect, and wherein the resonator further comprises a layer of piezoelectric material for exciting the resonator element to a resonance mode, the thickness of the layer of the piezoelectric material is within the range from 1 μm to 2 μm, and the thickness of the layer of single-crystalline silicon is within the range from 9 μm to 17 μm.

In certain embodiments, the resonator element comprises a layer of single-crystalline silicon doped with phosphorus atoms, introduced to the single-crystalline silicon from a surface of the silicon wafer perpendicular to the wafer plane, and the concentration $n_{dop}$ of the phosphorus atoms is according to the equation (i) or (ii) or (iii) of the first aspect, and wherein the resonator further comprises a layer of piezoelectric material for exciting the resonator element to a resonance mode, the thickness of the layer of the piezoelectric material is within the range from 1 μm to 2 μm, and the thickness of the layer of single-crystalline silicon is within the range from 9 μm to 17 μm.

In certain embodiments, the resonator element comprises a layer of single-crystalline silicon doped with phosphorus atoms, introduced to the single-crystalline silicon from a surface of the silicon wafer perpendicular to the wafer plane, and the concentration $n_{dop}$ of the phosphorus atoms is according to the equation (i) or (ii) or (iii) of the first aspect, and wherein the resonator further comprises a layer of piezoelectric material for exciting the resonator element to a resonance mode, the thickness of the layer of the piezoelectric material is within the range from 1 μm to 2 μm, and the thickness of the layer of single-crystalline silicon is within the range from 9 μm to 17 μm, and the variation of the resonance frequency in the temperature range from −30° C. to 85° C. is within ±30 parts per million with respect to the resonance frequency at the temperature 25° C.

In certain embodiments, the resonator element comprises a layer of single-crystalline silicon doped with phosphorus atoms and the concentration $n_{dop}$ of the phosphorus atoms is according to the equation (i) or (ii) or (iii) of the first aspect, and wherein the resonator further comprises a layer of piezoelectric material for exciting the resonator element to a resonance mode, the thickness of the layer of the piezoelectric material is within the range from 1 μm to 2 μm, and the thickness of the layer of single-crystalline silicon is within the range from 9 μm to 17 μm, and wherein the resonator element comprises an elongated material portion which is substantially parallel with a <100> crystalline axis of the layer of single-crystalline silicon within the plane of the layer of single-crystalline silicon, and the elongated material portion is configured to resonate in a length-extensional resonance mode or in a flexural resonance mode.

In certain embodiments, the resonator element comprises a layer of single-crystalline silicon doped with phosphorus atoms, introduced to the single-crystalline silicon from a surface of the silicon wafer perpendicular to the wafer plane, and the concentration $n_{dop}$ of the phosphorus atoms is according to the equation (i) or (ii) or (iii) of the first aspect, and wherein the resonator further comprises a layer of piezoelectric material for exciting the resonator element to a resonance mode, the thickness of the layer of the piezoelectric material is within the range from 1 μm to 2 μm, and the thickness of the layer of single-crystalline silicon is within the range from 9 μm to 17 μm, and wherein the resonator element comprises an elongated material portion which is substantially parallel with a <100> crystalline axis of the layer of single-crystalline silicon within the plane of the layer of single-crystalline silicon, and the elongated material portion is configured to resonate in a length-extensional resonance mode or in a flexural resonance mode.

In certain embodiments, the resonator element comprises a layer of single-crystalline silicon doped with phosphorus atoms, introduced to the single-crystalline silicon from a surface of the silicon wafer perpendicular to the wafer plane, and the concentration $n_{dop}$ of the phosphorus atoms is according to the equation (i) or (ii) or (iii) of the first aspect, and wherein the resonator further comprises a layer of piezoelectric material for exciting the resonator element to a resonance mode, the thickness of the layer of the piezoelectric material is within the range from 1 μm to 2 μm, and the thickness of the layer of single-crystalline silicon is within the range from 9 μm to 17 μm, and wherein the resonator element comprises an elongated material portion which is substantially parallel with a <100> crystalline axis of the layer of single-crystalline silicon within the plane of the layer of single-crystalline silicon, and the elongated material portion is configured to resonate in a length-extensional resonance mode or in a flexural resonance mode, and the variation of the resonance frequency in the temperature range from −30° C. to 85° C. is within ±30 parts per million with respect to the resonance frequency at the temperature 25° C.

In certain preferred embodiments, the concentration $n_{dop}$ of the phosphorus atoms is (i) within the range from $2.10\times10^{20}$ $cm^{-3}$ to $2.86\times10^{20}$ $cm^{-3}$ at $d/t_{DEV}$=0.1 and in the range from $1.26\times10^{20}$ $cm^{-3}$ to $1.72\times10^{20}$ $cm^{-3}$ at $d/t_{DEV}$=0.9 or (ii) in the range from $1.26\times10^{20}$ $cm^{-3}$ to $1.73\times10^{20}$ $cm^{-3}$ at $d/t_{DEV}$=0.1 and in the range from $2.10\times10^{20}$ $cm^{-3}$ to $2.86\times10^{20}$ $cm^{-3}$ at $d/t_{DEV}$=0.9 or (iii) in the range from $2.17\times10^{20}$ $cm^{-3}$ to $2.86\times10^{20}$ $cm^{-3}$ at $d/t_{DEV}$=0.1, in the range from $1.27\times10^{20}$ $cm^{-3}$ to $1.77\times10^{20}$ $cm^{-3}$ at $d/t_{DEV}$=0.5, and in the range from $2.17\times10^{20}$ $cm^{-3}$ to $2.86\times10^{20}$ $cm^{-3}$ at $d/t_{DEV}$=0.9.

In certain yet more preferred embodiments, the concentration $n_{dop}$ of the phosphorus atoms is (i) in the range from $2.14\times10^{20}$ $cm^{-3}$ to $2.75\times10^{20}$ $cm^{-3}$ at $d/t_{DEV}$=0.1 and in the range from $1.28\times10^{20}$ $cm^{-3}$ to $1.70\times10^{20}$ $cm^{-3}$ at $d/t_{DEV}$=0.9 or (ii) in the range from $1.28\times10^{20}$ $cm^{-3}$ to $1.71\times10^{20}$ $cm^{-3}$ at $d/t_{DEV}$=0.1 and in the range from $2.14\times10^{20}$ $cm^{-3}$ to $2.75\times10^{20}$ $cm^{-3}$ at $d/t_{DEV}$=0.9 or (iii) in the range from $2.18\times10^{20}$ $cm^{-3}$ to $2.75\times10^{20}$ $cm^{-3}$ at $d/t_{DEV}$=0.1, in the range from $1.28\times10^{20}$ $cm^{-3}$ to $1.75\times10^{20}$ $cm^{-3}$ at $d/t_{DEV}$=0.5, and in the range from $2.18\times10^{20}$ $cm^{-3}$ to $2.75\times10^{20}$ $cm^{-3}$ at $d/t_{DEV}$=0.9.

In certain embodiments, the resonator element comprises two layers of single-crystalline silicon.

In certain embodiments, the resonator element comprises two layers of single-crystalline silicon, and one of the two layers of single-crystalline silicon is doped with phosphorus atoms in accordance with one of the options (i), (ii), or (iii) and the other of the two layers of single-crystalline silicon is doped with phosphorus atoms in accordance with one of the options (i), (ii), or (iii).

In certain embodiments, the resonator element is free from precipitation of compounds comprising silicon and phosphorus.

In certain embodiments, the layer of single-crystalline silicon is doped with phosphorus atoms using thermal diffusion doping.

In certain embodiments, the concentration $n_{dop}$ of the phosphorus atoms has a local maximum concentration at $d/t_{DEV}$ in the range from 0.85 to 0.95.

In certain embodiments, the resonator element comprises two layers of single-crystalline silicon, wherein a <100> crystalline axis of a first of said two layers of single-crystalline silicon and a <100> crystalline axis of the second of said two layers of single-crystalline silicon are aligned substantially parallel to each other within the respective planes of the layers.

According to a second example aspect of the invention there is provided a method of manufacturing the MEMS resonator of any preceding claim, comprising:

taking a starting wafer substrate;

performing process steps to manufacture the resonator element and the cavity, wherein the layer of single-crystalline silicon is doped using thermal diffusion doping.

Different non-binding example aspects and embodiments have been presented in the foregoing. The above embodiments and embodiments described later in this description are used to explain selected aspects or steps that may be utilized in implementations of the present invention. It should be appreciated that corresponding embodiments apply to other example aspects as well. Any appropriate combinations of the embodiments can be formed.

BRIEF DESCRIPTION OF THE DRAWINGS

The invention will now be described, by way of example only, with reference to the accompanying drawings, in which:

FIG. 1 shows a schematic cross-section of a MEMS resonator in accordance with certain embodiments;

FIGS. 2A-2C show manufacturing steps of the MEMS resonator of the type shown in FIG. 1 in accordance with certain embodiments;

FIG. 3 shows a change of dopant concentration in accordance with certain embodiments;

FIGS. 4A-4C show further manufacturing steps in accordance with certain embodiments;

FIGS. 7A-7D show certain manufacturing steps in accordance with certain embodiments;

FIGS. 8-10 show the dopant concentration in accordance with certain embodiments;

DETAILED DESCRIPTION

Figures 5A, 5B, 5C, 5D, 5E, 5F:
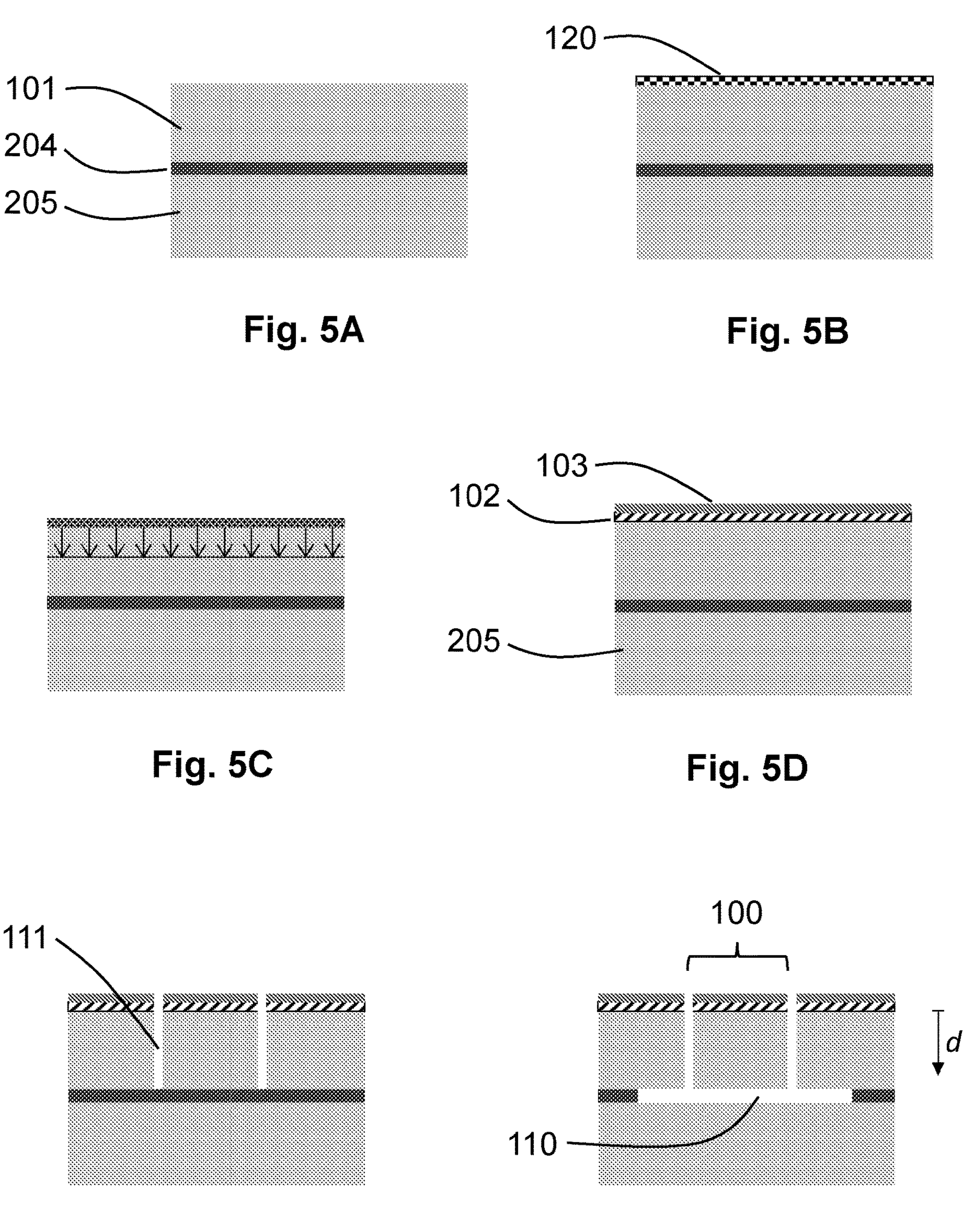
FIGS. 5A-5F show an alternative manufacturing method.

Embodiments of the present invention disclose a phosphorus doping profile of a silicon MEMS resonator which results in a significant reduction in the temperature variation of the resonance frequency (i.e., thermal stability) of the resonator. A resonator according to certain embodiments has a thermal stability comparable or better than that of an AT-cut quartz resonator. Embodiments of the invention have also other advantages. The phosphorus dopant concentration according to the embodiments is such that precipitation of undesired compounds of phosphorus and silicon (such as SiP) is minimal. In addition, the phosphorus doping profile is achieved at a relatively low annealing temperature using an annealing time suitable for cost-effective mass production.

The structure of temperature-stable MEMS resonators according to certain embodiments of the invention comprises of a single-crystalline silicon layer, a piezoelectric layer, and an electrically conducting top electrode layer. In certain embodiments, a cross section of such a resonator 150 is illustrated in FIG. 1. Layers 101-105 are shown in the drawing with the following explanations:

- Layer 101=doped single-crystalline silicon layer (also referred to as a device layer): Phosphorus doped single crystal silicon forms more than 50% of the mass of the resonator element 100. In certain embodiments the doped silicon layer acts as the bottom electrode layer.
- Layer 102=piezoelectric layer: The material of this layer may be AlN, ZnO, Sc-doped AlN ($Sc_xAl_{1-x}N$ where $x<0.5$), or another piezoelectric crystalline compound. Transduction of the resonator is based on applying an alternating electric field across the piezoelectric layer.
- Layer 103=top electrode layer: On the top side of the piezoelectric layer there is a top electrode layer. The material of this layer may be Al, Mo, Au, an alloy, or degenerately doped polysilicon or degenerately doped single-crystalline silicon or any other suitable material that is electrically conductive.
- Layer 104=buried silicon oxide layer: This layer provides galvanic isolation between the doped single-crystalline layer 101 and the handle layer 105.
- Layer 105=(single-crystalline) silicon handle layer (or a handle layer made from another material), also referred to as a substrate.

The resonator 150 comprises a resonator element 100 which contains the vibrational energy of the resonator (apart from small leakage of the energy to the surrounding structures around the resonating element). The resonator element 100 comprises material portions within the layers 101 (doped single-crystalline silicon layer), 102 (piezoelectric layer), and 103 (top electrode layer). The portion of the piezoelectric layer 102 within the resonator element 100 forms a piezoelectric actuator which may be used for exciting the resonator element 100 to a resonance mode. A cavity 110 separates the lower surface of the resonating element 100 from the handle layer 105.

In certain embodiments, the lateral dimensions of the cavity 110 are in the range from 100 μm to 800 μm. The depth of the cavity is in the range from 0.5 μm to 200 μm such as from 2 μm to 50 μm.

In certain embodiments, the thickness of the single-crystalline silicon layer 101 is preferably in the range from 2 μm to 40 μm, more preferably in the range from 5 μm to 20 μm, and yet more preferably in the range from 9 μm to 17 μm.

In certain embodiments, the thickness of the piezoelectric layer 102 is in the range from 0.5 μm to 3 μm, such as from 1 μm to 2 μm.

In certain embodiments, the thickness of the top electrode layer 103 is in the range from 0.05 μm to 1 μm such as from 0.15 μm to 0.4 μm. In certain embodiments, the material of the top electrode layer 103 is degenerately doped single-crystalline silicon and the thickness of the layer 103 is in the range from 2 μm to 40 μm, such as from 5 μm to 20 μm.

In certain embodiments, a cavity-SOI (CSOI) wafer, illustrated in FIG. 2A, is the starting wafer substrate for the fabrication of MEMS resonators 150. The cavity-SOI wafer contains cavities 110 formed in the single-crystalline silicon handle layer 105, a silicon oxide layer 104 formed on the top surface of the silicon handle layer 105, and a single-crystalline silicon device layer 101 bonded to the silicon oxide layer 104. In certain embodiments, a film of PSG glass 120 containing phosphorus for n-type doping is deposited on the upper surface of the cavity-SOI wafer in a $POCl_3$ furnace as illustrated in FIG. 2B. In certain embodiments, the deposition time is in the range from 30 min to 200 min while the temperature is within the range from 1000° C. to 1100° C. After the PSG deposition, phosphorus is diffused into the single-crystalline silicon device layer 101 in a drive-in process step which takes place for example at a temperature within the range from 1000° C. to 1100° C. phosphorus over the time ranging from 120 min to 600 min. In advantageous embodiments, the PSG layer 120 is then removed by wet etchant containing hydrofluoric acid. The phosphorus dopant is then diffused into the device layer 101 during an annealing for example at temperature in the range from 1100° C. to 1220° C. During the annealing, phosphorus dopants diffuse from the top surface layer of the single-crystalline silicon device layer 101 towards the bottom of the device layer 101 as illustrated in FIG. 2C, wherein d denotes a distance from the top surface layer. In an exemplary case with a device layer 101 of the thickness 11 um, the annealing takes from 10 h to 45 h. In other embodiments with the device layer 101 thickness 5 um, the annealing may take from 2 h to 10 h. In other embodiments of the invention with the device layer 101 of thickness 15 um, the annealing may take from 19 h to 84 h.

The change of the phosphorus dopant concentration within the device layer 101 during the annealing is further illustrated in FIG. 3. After a short annealing step, the gradient in the phosphorus dopant concentration remains relatively high. After a long annealing, the dopant concentration is more uniform.

In certain embodiments, annealing of the phosphorus dopant is followed by wet oxidation at a temperature in the range from 1050° C. to 1150° C. for a time in the range from 5 h to 15 h. The oxide may then be removed by wet etchant containing hydrofluoric acid.

In certain embodiments, annealing of the phosphorus dopant is followed by a shallow etch of the surface layer of the device layer to remove a region in which the structure of single-crystalline layer of silicon has suffered from too high dopant concentration. The depth of the etch may be in the range from 50 nm to 500 nm.

In certain embodiments, phosphorus doping of the single-crystalline silicon layer 101 is made by thermal diffusion doping starting from a solid doping material such as spin-on phosphorus doped glass.

In certain embodiments, as illustrated in FIG. 4A, the next fabrication step is a deposition of the piezoelectric layer 102 such as AlN or Sc-doped AlN, or another piezoelectric material on the upper surface of the cavity-SOI wafer. Next, an electrode layer 103 is deposited in certain embodiments as illustrated in FIG. 4B. The material of the electrode layer may be gold, aluminum, molybdenum, tungsten, (doped) polysilicon, or another electrically conducting material. In certain embodiments, a vertical trench 111 through the material layers forming the resonator element 100 (the single-crystalline silicon device layer 101, the piezoelectric layer 102, and the top electrode layer 103) is then etched for example by using deep reactive ion etching to pattern the layout of the MEMS resonator element 100 as illustrated in FIG. 4C.

In certain alternative embodiments, fabrication of the resonator uses a silicon-on-insulator (SOI) wafer as the starting wafer. FIGS. 5A-F illustrate exemplary manufacturing steps which may be used to fabricate resonator elements 100 on a SOI wafer. FIG. 5A shows the silicon oxide layer (reference numeral 204) on top of the handle layer (reference numeral 205), and the single-crystalline device layer 101 on top of the silicon oxide layer 204. Doping of the single-crystalline device layer 101 of the SOI wafer proceeds in the same way as for CSOI wafers. A PSG layer 120 is deposited on the device layer and the phosphorus atoms are driven into the device layer during a drive-in process step as illustrated in FIG. 5B. The PSG layer is then removed and the SOI wafer is annealed to diffuse phosphorus atoms deeper into the device layer 101 as illustrated in FIG. 5C. Substantially the same process parameters (i.e., temperature vs. time profiles for drive-in and annealing) may be used to dope SOI wafers and cavity-SOI wafers with the same device layer thickness. A piezoelectric layer 102 and a top electrode layer 103 may then be deposited as illustrated in FIG. 5D. Etching of the vertical trench 111 illustrated in FIG. 5E defines the lateral dimensions of the resonator element 100. For example a HF vapor etch is then used to create a cavity 110 under the resonator element 100 and thereby to release it from the handle layer 205, as illustrated in FIG. 5F.

Figure 6:
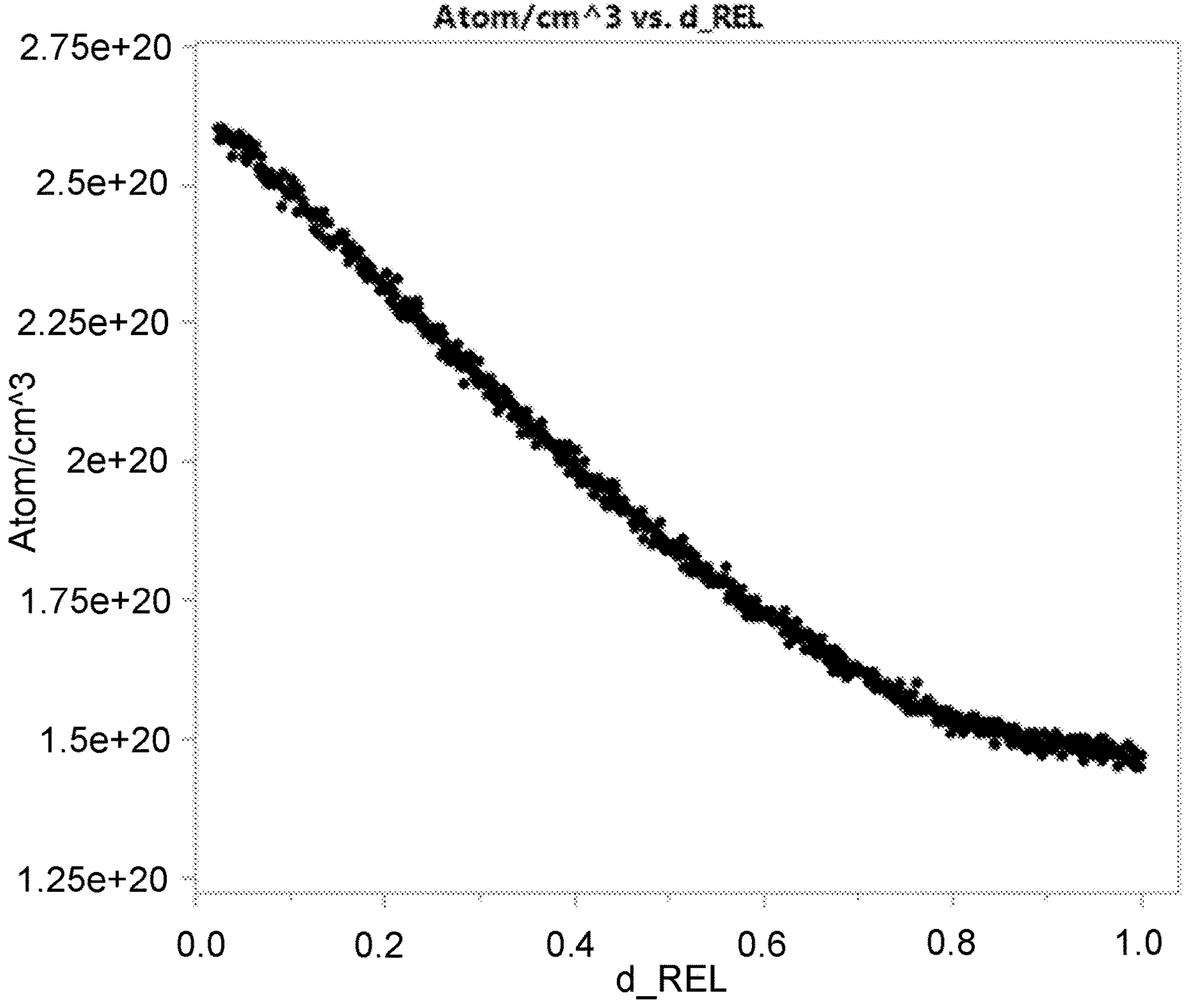
FIG. 6 shows the dopant concentration in the function of a distance in accordance with certain embodiments.

In certain embodiments, the concentration of the phosphorus dopant varies with the distance from the top surface of the single-crystalline silicon layer 101 as illustrated in FIG. 6. The vertical axis in FIG. 6 is the absolute concentration of the phosphorus dopant $n_{dop}$ in the units of phosphorus atoms per cubic centimeter as measured in a secondary-ion mass spectrometry (SIMS) instrument. The horizontal axis in FIG. 6 is relative depth $d_{REL}$ Which is defined as the distance d from the top surface of the single-crystalline silicon layer 101 divided by the thickness $t_{DEV}$ of the single crystalline silicon layer 101, i.e., $d_{REL}=d/t_{DEV}$. In the exemplary embodiment illustrated by the data in FIG. 6, the thickness $t_{DEV}=11$ μm. According to the data, the general trend is that phosphorus dopant concentration (monotonously) decreases with the distance, i.e., when moving deeper into the single-crystalline silicon layer 101. Near the top surface of the single-crystalline silicon layer 101 at $d_{REL}=0.1$, the phosphorus dopant concentration $n_{dop}=2.48\times10^{20}$ $cm^{-3}$ while near the bottom surface of the layer 101 at $d_{REL}=0.9$, the concentration $n_{dop}=1.49\times10^{20}$ $cm^{-3}$. The concentration at $d_{REL}=0.1$ is 66% higher than the concentration at $d_{REL}=0.9$.

The measured sheet resistance of a 10.9±0.2 μm thick device layer with the doping profile according to FIG. 6 was 0.48±0.01 Ohms/square which corresponds to average silicon resistivity of 0.52±0.02 mOhm cm.

The phosphorus dopant distribution according to embodiments of the invention improves the thermal stability of a silicon MEMS resonator to the same level as in the state-of-art quartz resonator, as discussed below referring to FIGS. 11-13.

Substantially the same phosphorus dopant distribution results in quartz-level thermal stability for a silicon MEMS resonator in various embodiments of the invention. The resonance mode of the resonator may be, e.g., a length-extensional, flexural, bulk-acoustic, or torsional mode and the respective geometries of the resonator may have different forms. The principal motion during the resonance motion may occur either in-plane or out-of-plane (the term “plane” referring to the plane of the device layer 101), and the nominal frequency of the resonator may be in the MHz range such as from 1 MHz to 200 MHz or in the kHz range such as from 30 KHz to 1000 KHz or at 32 kHz. The thicknesses of the device layer 101, the piezoelectric layer 102, and the top electrode layer 103 may change depending on the implementation.

Within certain embodiments, the phosphorus dopant concentration $n_{dop}$ is preferably within the range from $1.99\times10^{20}$ $cm^{-3}$ to $2.97\times10^{20}$ $cm^{-3}$ at $d/t_{DEV}=0.1$ and within the range from $1.20\times10^{20}$ $cm^{-3}$ to $1.78\times10^{20}$ $cm^{-3}$ at $d/t_{DEV}=0.9$, more preferably $n_{dop}$ is within the range from $2.10\times10^{20}$ $cm^{-3}$ to $2.86\times10^{20}$ $cm^{-3}$ at $d/t_{DEV}=0.1$ and within the range from $1.26\times10^{20}$ $cm^{-3}$ to $1.72\times10^{20}$ $cm^{-3}$ at $d/t_{DEV}=0.9$, yet more preferably $n_{dop}$ is within the range from $2.14\times10^{20}$ $cm^{-3}$ to $2.75\times10^{20}$ $cm^{-3}$ at $d/t_{DEV}=0.1$ and within the range from $1.28\times10^{20}$ $cm^{-3}$ to $1.70\times10^{20}$ $cm^{-3}$ at $d/t_{DEV}=0.9$.

We note that values of phosphorus doping concentration in this disclosure always refer to the phosphorus concentrations within the resonator element 100 even if not explicitly stated since doping of silicon layers outside the resonator element 100 does not affect the resonance frequency of the MEMS resonator.

In certain alternative embodiments, in the so-called doping-before-bonding method, a (blank) single-crystalline silicon wafer 301 is the starting wafer substrate for the fabrication of MEMS resonators. A film of PSG glass 320 is deposited on the silicon wafer 301 in a $POCl_3$ furnace as illustrated in FIG. 7A. During a drive-in process step, phosphorus dopants diffuse into a surface layer 321 of the silicon wafer 301. PSG layer 320 may then be removed by etching. During annealing at a temperature in the range from 1100° C. to 1220° C., phosphorus dopants diffuse from the surface layer 321 into deeper layers of the wafer as illustrated in FIG. 7B. In certain embodiments, a part of surface layer 321 of the silicon wafer 301 is then removed by etching. The depth of the etch may be 50 nm . . . 500 nm.

The doped silicon wafer 301 is then bonded to a silicon (handle) wafer. In certain embodiments, the handle wafer 305 contains cavities 310 (cavity wafer) as illustrated in the exemplary embodiment of FIG. 7C. In this example, the doped silicon wafer 301 is bonded to the handle wafer 305 so that the bonding interface is formed between the original surface layer 321 and the silicon oxide layer 304 on the handle wafer 305. The (undoped) backside of the doped silicon wafer 301, now part of the bonded wafer pair, is then removed for example by grinding and polishing so that the remaining (doped) front side of the doped silicon wafer 301 becomes the device layer 101 of the resonator 150 with the designed thickness. Fabrication of the resonators may be then proceed as discussed in context of FIGS. 4A-C above.

In the embodiment illustrated in FIG. 7D, the doped silicon wafer 301 is bonded to a silicon handle wafer 335 which has a silicon oxide layer 334. The (undoped) backside of the doped silicon wafer 301, now part of the bonded wafer pair, is then removed (for example by grinding and polishing) so that the remaining (doped) front side of the doped silicon wafer 301 becomes the device layer 101 of the resonator 150 with the designed thickness. Fabrication of the resonators may be then proceed as discussed in context of FIGS. 5D-F above.

In certain embodiments using the doping-before-bonding method (illustrated in FIGS. 7A-D), the concentration of the phosphorus dopant ($n_{dop}$) within the device layer 301 increases from the top surface 322 (of the bonded wafer pair) towards the surface 321 facing the (handle) layer (such as the layer formed by the cavity wafer 305 or silicon wafer 335). This behavior of concentration has been illustrated in FIG. 8.

Figure 9:
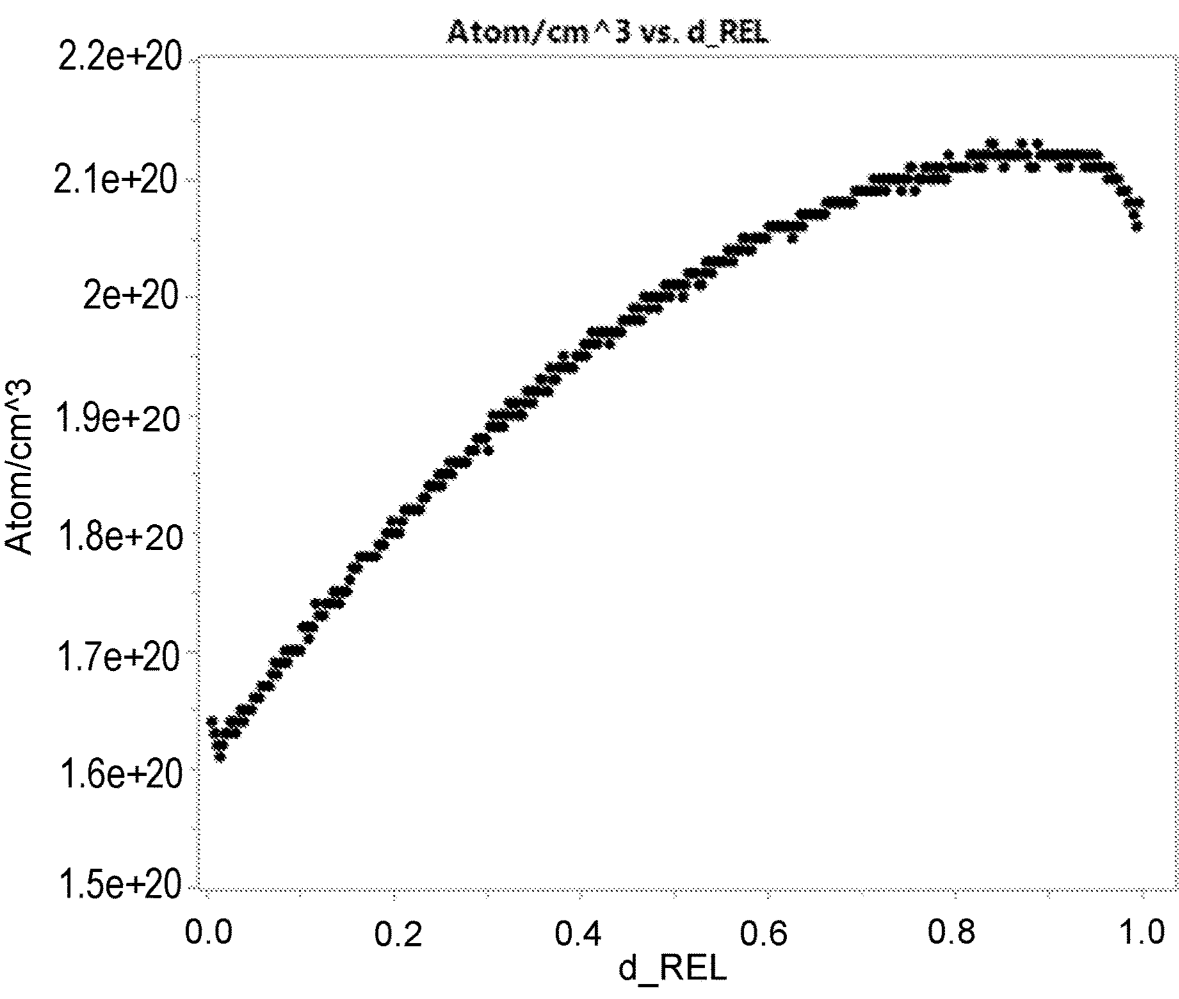

In one embodiment, the concentration of the phosphorus dopant varies with the distance from the top surface of the single-crystalline silicon layer 301 as illustrated in FIG. 9. The vertical axis in FIG. 9 is the absolute concentration of the phosphorus dopant $n_{dop}$ as measured in a secondary-ion mass spectrometry (SIMS) instrument. The horizontal axis in FIG. 9 is the relative depth $d_{REL}$ which is defined as the distance d from the top surface of the single-crystalline silicon layer 301 divided by the thickness $t_{DEV}$ of the single crystalline silicon layer 301, i.e., $d_{REL}=d/t_{DEV}$. In the exemplary embodiment illustrated by the data in FIG. 9, the thickness $t_{DEV}=10.5$ μm.

According to the data, apart from the areas close to the top and bottom surfaces of the single-crystalline silicon layer 301, the phosphorus dopant concentration (monotonously) increases with the distance d, i.e., when moving deeper into the single-crystalline silicon layer 301. Near the top surface of the single-crystalline silicon layer 301 at $d_{REL}=0.1$, the phosphorus dopant concentration $1.71\times10^{20}$ $cm^{-3}$ while near the bottom surface of the layer 301 at $d_{REL}=0.9$, the concentration $n_{dop}=2.12\times10^{20}$ $cm^{-3}$. The concentration at $d_{REL}=0.9$ is 24% higher than the concentration at $d_{REL}=0.1$.

In some embodiments, there is a maximum in the phosphorus dopant concentration close to the bottom surface of the single-crystalline silicon layer 301 in MEMS resonators made by using the doping-before-bonding method. The position of the maximum concentration may be at the distance $d_{REL}$ in the range from 0.85 to 0.95 as exemplified by the data in FIG. 9.

There are several embodiments which make use of the doping-before-bonding method. Substantially the same phosphorus dopant distribution as the one illustrated in FIG. 9 results in quartz-level thermal stability for a silicon MEMS resonator in which the resonance mode may be, e.g., a length-extensional, flexural, bulk-acoustic, or torsional mode and the respective geometries of the resonator may have different forms. The principal motion during the resonance motion may occur either in-plane or out-of-plane (the term "plane" referring to the plane of the device layer 301), and the nominal frequency of the resonator may be in the MHz range such as from 1 MHz to 200 MHz or in the kHz range such as from 30 KHz to 1000 KHz or at 32 kHz. The thicknesses of the device layer 101, the piezoelectric layer 102, and the top electrode layer 103 may change depending on the implementation.

The inventors have carried out several experiments on thermal stability of silicon MEMS resonators at different phosphorus dopant distributions using the doping-before-bonding method. The findings of these experiments can be summarized as follows. In certain embodiments, the phosphorus dopant concentration $n_{dop}$ is preferably within the range from $1.20\times10^{20}$ $cm^{-3}$ to $1.80\times10^{20}$ $cm^{-3}$ at $d/t_{DEV}=0.1$ and within the range from $2.02\times10^{20}$ $cm^{-3}$ to $2.97\times10^{20}$ $cm^{-3}$ at $d/t_{DEV}=0.9$, more preferably $n_{dop}$ is within the range from $1.26\times10^{20}$ $cm^{-3}$ to $1.73\times10^{20}$ $cm^{-3}$ at $d/t_{DEV}=0.1$ and within the range from $2.10\times10^{20}$ $cm^{-3}$ to $2.86\times10^{20}$ $cm^{-3}$ at $d/t_{DEV}=0.9$, yet more preferably $n_{dop}$ is within the range from $1.28\times10^{20}$ $cm^{-3}$ to $1.71\times10^{20}$ $cm^{-3}$ at $d/t_{DEV}=0.1$ and within the range from $2.14\times10^{20}$ $cm^{-3}$ to $2.75\times10^{20}$ $cm^{-3}$ at $d/t_{DEV}=0.9$.

Figure 10:
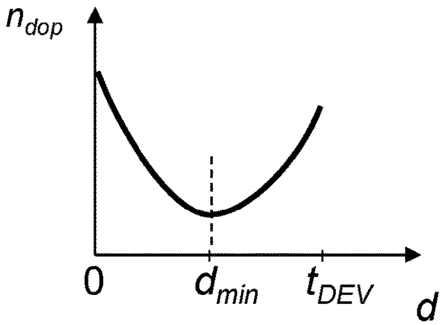

In certain alternative embodiments which make use of a double-sided-doping method, the single-crystalline device layer of silicon is doped both before and after the silicon wafer forming the device layer is bonded to the handle layer. In the first doping, phosphorus dopants are introduced to the device layer as discussed above in the context of the doping-before-bonding method with reference to FIGS. 7A-D. In the second doping, phosphorus dopants are introduced to the device layer as discussed above in the context of doping of cavity-SOI and SOI wafers with reference to FIGS. 2A-C and FIGS. 5A-C. In the double-sided-doping method, the profile of the phosphorus dopant concentration varies as a function of the relative depth $d_{REL}$ as illustrated in FIG. 10.

When moving from the surface of the single-crystalline silicon layer 101, 301 towards the bottom surface of the layer 101, 301, i.e., when the distance d increases from 0 towards $t_{DEV}$, the phosphorus dopant concentration first decreases, then goes through a minimum at a certain distance denoted by $d_{min}$, and then increases again towards the bottom surface of the silicon layer 101, 301. However, near the bottom and top surfaces, this general behaviour of the phosphorus concentration may be slightly different in certain embodiments. Particularly, in certain embodiments, there may be a shallow maximum in the phosphorus concentration at $d/t_{DEV}\approx0.9$, similarly to the behavior illustrated by the data in FIG. 9.

In certain embodiments using the double-sided-doping method, the doping process parameters (such as PSG layer thickness, drive in time, and annealing time) for the two doping steps are substantially identical. It this case, the dopant concentration has a minimum value approximately in the middle of the device layer ($d_{min}\approx0.5$ $t_{DEV}$). Such a "symmetric" double-sided doping makes it possible to strongly dope resonators with relatively thick device layers using relatively short annealing times. Increase in the thickness of the device layer of the resonator element makes it possible to reach larger vibrational energy which in turn improves noise properties of an oscillator circuit using the resonator. In an exemplary case of a thermally stable silicon MEMS resonator, the device layer 101 has the thickness 22 μm and the two annealing steps of symmetric double-sided phosphorus doping may take from 10 h to 45 h each. In another exemplary case of a thermally stable silicon MEMS resonator, the device layer 101 has the thickness 10 μm and the two annealing steps of symmetric double-sided phosphorus doping may take from 2 h to 10 h each. In yet another exemplary case with device layer 101 of the thickness 30 μm, the two annealing steps may take from 19 h to 84 h each.

In certain embodiments, the phosphorus dopant concentration $n_{dop}$ is preferably within the range from $2.08\times10^{20}$ $cm^{-3}$ to $2.97\times10^{20}$ $cm^{-3}$ at $d/t_{DEV}=0.1$, within the range from $1.20\times10^{20}$ $cm^{-3}$ to $1.86\times10^{20}$ $cm^{-3}$ at $d/t_{DEV}=0.5$, and within the range from $2.08\times10^{20}$ $cm^{-3}$ to $2.97\times10^{20}$ $cm^{-3}$ at $d/t_{DEV}=0.9$, more preferably $n_{dop}$ is within the range from $2.17\times10^{20}$ $cm^{-3}$ to $2.86\times10^{20}$ $cm^{-3}$ at $d/t_{DEV}=0.1$, within the range from $1.27\times10^{20}$ $cm^{-3}$ to $1.77\times10^{20}$ $cm^{-3}$ at $d/t_{DEV}=0.5$, and within the range from $2.17\times10^{20}$ $cm^{-3}$ to $2.86\times10^{20}$ $cm^{-3}$ at $d/t_{DEV}=0.9$, yet more preferably $n_{dop}$ within the range from $2.18\times10^{20}$ $cm^{-3}$ to $2.75\times10^{20}$ $cm^{-3}$ at $d/t_{DEV}=0.1$, within the range from $1.28\times10^{20}$ $cm^{-3}$ to $1.75\times10^{20}$ $cm^{-3}$ at $d/t_{DEV}=0.5$, and within the range from $2.18\times10^{20}$ $cm^{-3}$ to $2.75\times10^{20}$ $cm^{-3}$ at $d/t_{DEV}=0.9$.

Figure 11:
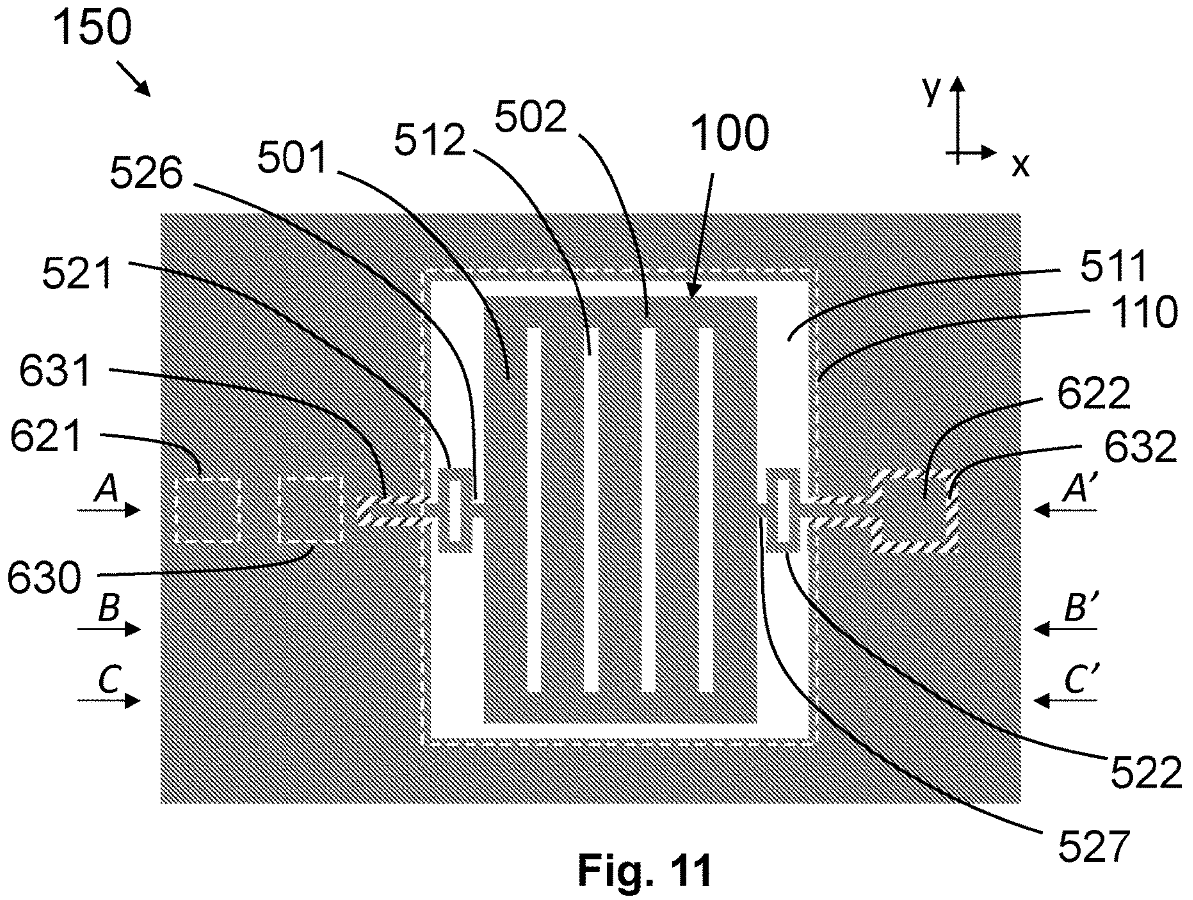
FIG. 11 shows a layout of a MEMS resonator in accordance with certain embodiments.

An exemplary layout of a temperature-stable MEMS resonator 150 is illustrated in FIG. 11. The figure illustrates a length-extensional-mode resonator containing a resonator element 100. A vertical trench 511 through the material layers 101, 102, and 103 defines the lateral dimensions of the resonator element 100. The resonator element 100 is formed of a number of (here: five) elongated resonator sub-elements 501 which are separated from adjacent sub-elements 501 by vertical trenches 512 apart from distal material portions of the elongated sub-elements 501. These distal portions are intercoupled by coupling elements 502.

The resonator element 100 vibrates in a single collective length-extensional resonance mode with the predominant motion along the longitudinal axis of the elongated sub-elements 501 (the y direction). The resonator element 100 is tethered using suspension elements (521, 522) fixed to nodal positions (526, 527) of the length-extensional resonance mode (and fixed to respective support structure(s) at their other end). The suspension elements (521, 522) comprise elongated material portions aligned along the y direction to provide for mechanical compliance along the x direction so that mechanical stresses within the resonator material stack (layers 101, 102, and 103) are relaxed.

In some embodiments, to minimize the variation of the resonance frequency with temperature, the longitudinal axis of the sub-elements 501 (the y direction) is aligned substantially along a <100> crystalline axis of the single-crystalline silicon within the device layer 101.

Figure 12A:
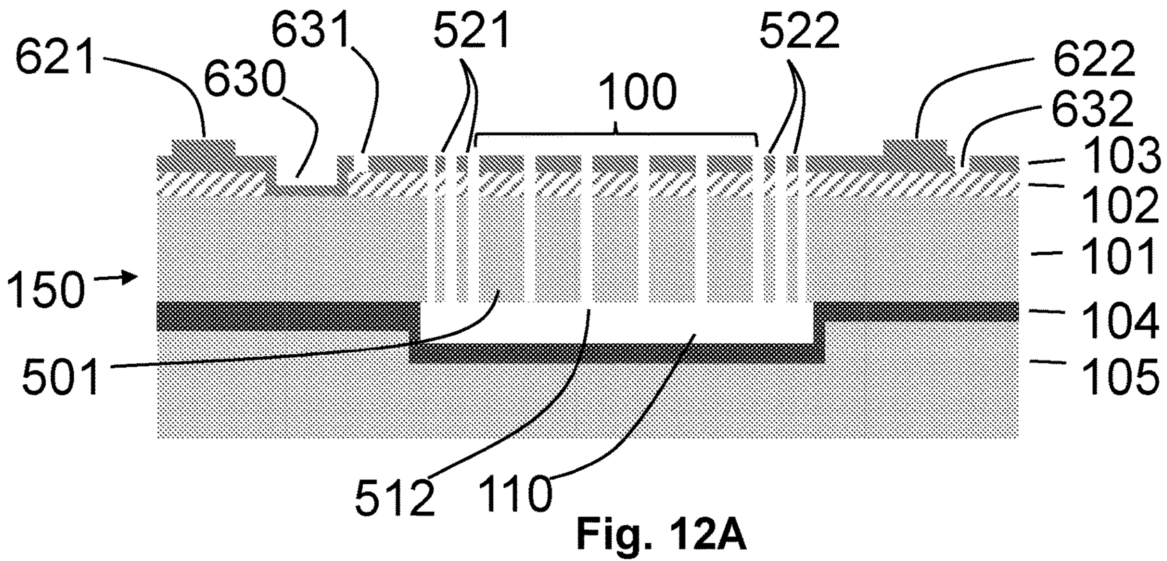
FIGS. 12A-12C show further features of the MEMS resonator of FIG. 11 in accordance with certain embodiments.
Figure 12B:
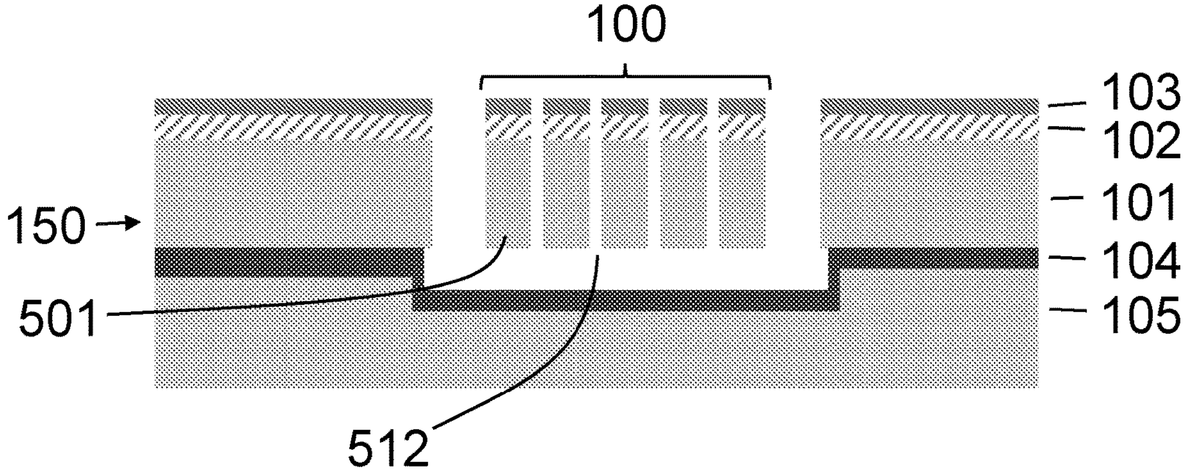
Figure 12C:
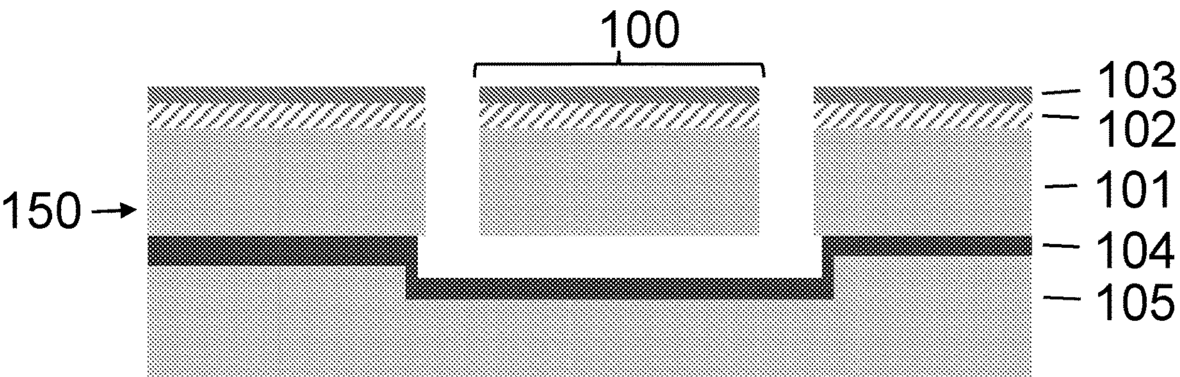

FIGS. 12A-C illustrate further features of the resonator of FIG. 11. The cross-section AA' along the symmetry axis in the y direction is illustrated in FIG. 12A. A contact pad 621 is provided for making an electrical connection to the doped single-crystalline silicon layer 101 which is used in this embodiment as the bottom electrode layer. An opening 630 in the piezoelectric layer 102 is formed to provide a pathway for an electrical interconnect through the piezoelectric layer 102. A contact pad 622 is provided for making an electrical connection to the top electrode layer 103. The top electrode 103 is removed in some areas 631, 632 to create galvanic isolation between the two electrodes. To excite the mechanical resonance motion, an AC voltage at the resonant frequency of the in-plane length-extensional resonator element 100 is connected to the contact pads 621 and 622 which creates an AC electric field across the piezoelectric film 102 which in turn creates a force in the plane of the piezoelectric film and excites the resonance motion.

The cross-section BB' of the resonator of FIG. 11 is illustrated in FIG. 12B. In this cross-section, trenches 512 separate the five resonator sub-elements 501.

The cross-section CC' of the resonator of FIG. 11 is illustrated in FIG. 12C. In this cross-section, the five resonator sub-elements 501 and their coupling elements 502 form a single material portion.

Figure 13A:
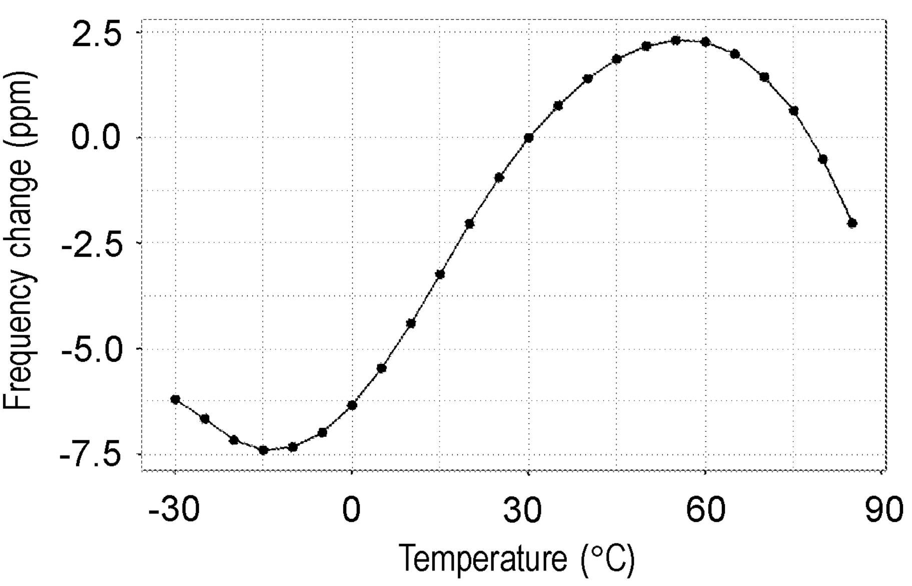
FIGS. 13A-13B shows temperature variation of the resonance frequency of a MEMS resonator in accordance with certain embodiments.

Embodiments of the invention result in a significant reduction in the temperature variation of the resonance frequency of the MEMS resonator. To illustrate this point, FIG. 13A represents measured resonance frequency of 24 MHz length-extensional mode resonators when the temperature is changed over the temperature range from −30° C. to 85° C. The vertical axis of FIG. 13A represents the frequency difference of a particular resonator with respect to the frequency of that resonator at the temperature 30° C. The unit of the frequency difference is parts per million (ppm) relative to the frequency at the temperature 30° C. The data of FIG. 13A shows that the variation of the resonance frequency in the temperature range from −30° C. to 85° C. is in the range from −7.5 ppm to +2.5 ppm. The data of FIG. 13A is for interconnected length-extensional resonators with the design substantially according to the illustrations of FIGS. 11 and 12A-C and with the phosphorus doping concentration profile substantially identical to the doping profile illustrated in FIG. 6.

Figure 13B:
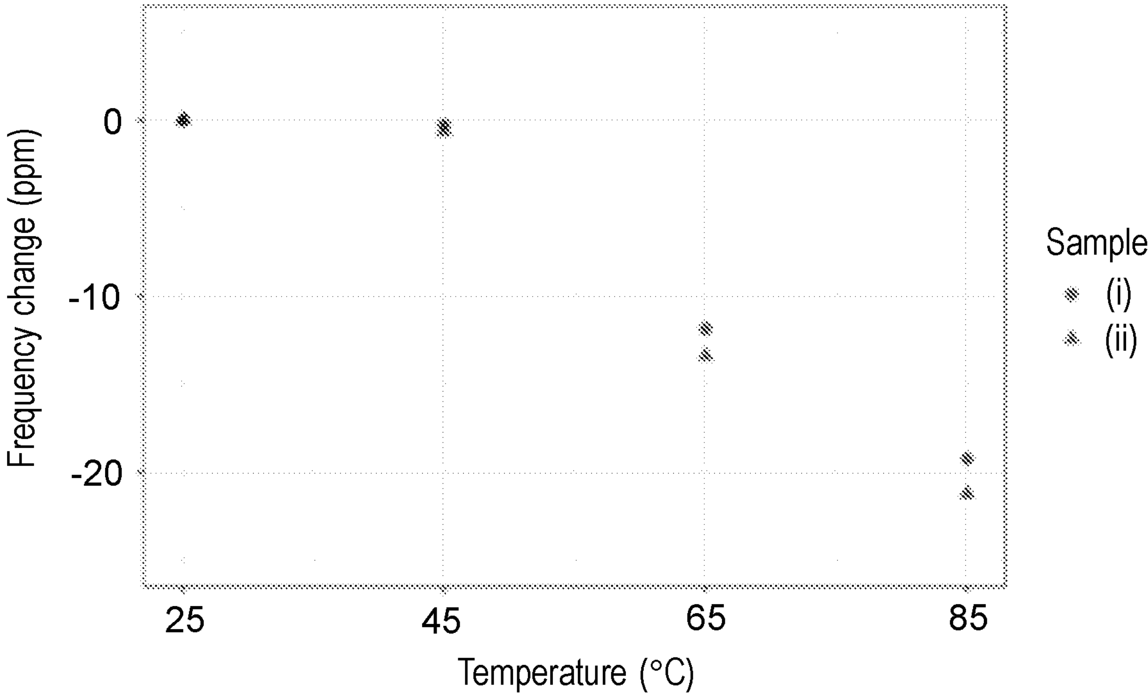

FIG. 13B represents measured resonance frequency of 24 MHz length-extensional mode resonators for which the doping-before-bonding method was used for phosphorus doping. The vertical axis of FIG. 13B represents the frequency difference of a particular resonator with respect to the frequency of that resonator at the temperature 25° C. The unit of the frequency difference is parts per million (ppm) relative to the frequency at the temperature 25° C. The data of FIG. 13B shows that the resonance frequency decreases by about 20 ppm for these two particular resonator specimens when the temperature is increased from 25° C. to 85° C. The data of FIG. 13B is for interconnected length-extensional resonators with the design substantially according to the illustrations of FIGS. 11 and 12A-C and with a phosphorus doping concentration profile substantially identical to the doping profile illustrated in FIG. 9.

Similar results are obtainable for MEMS resonators having the phosphorus doping profile of that shown in the preceding with reference to FIG. 10.

In advantageous embodiments of thermally stable silicon MEMS resonators with the phoshorus doping profile according to the invention, the variation of the resonance frequency in the temperature range from −30° C. to 85° C. is within +30 parts per million with respect to the resonance frequency at the temperature 25° C. In more advantageous embodiments of thermally stable silicon MEMS resonators with the phoshorus doping profile according to the invention, the variation of the resonance frequency in the temperature range from −30° C. to 85° C. is within +10 parts per million with respect to the resonance frequency at the temperature 25° C.

Figure 14A:
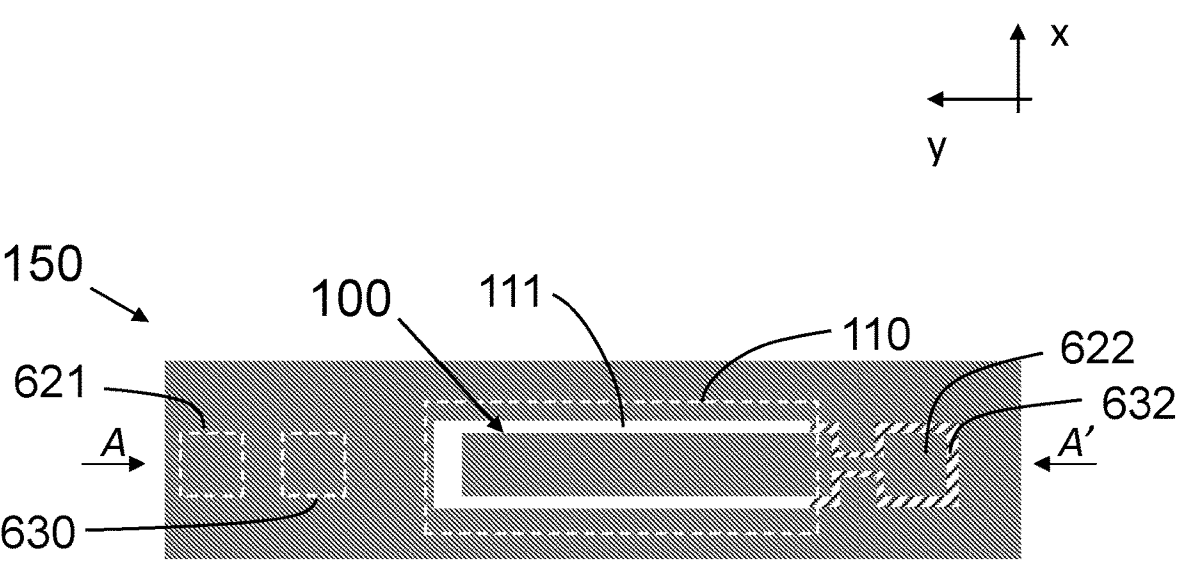
FIGS. 14A-14B show another MEMS resonator in accordance with certain embodiments.
Figure 14B:
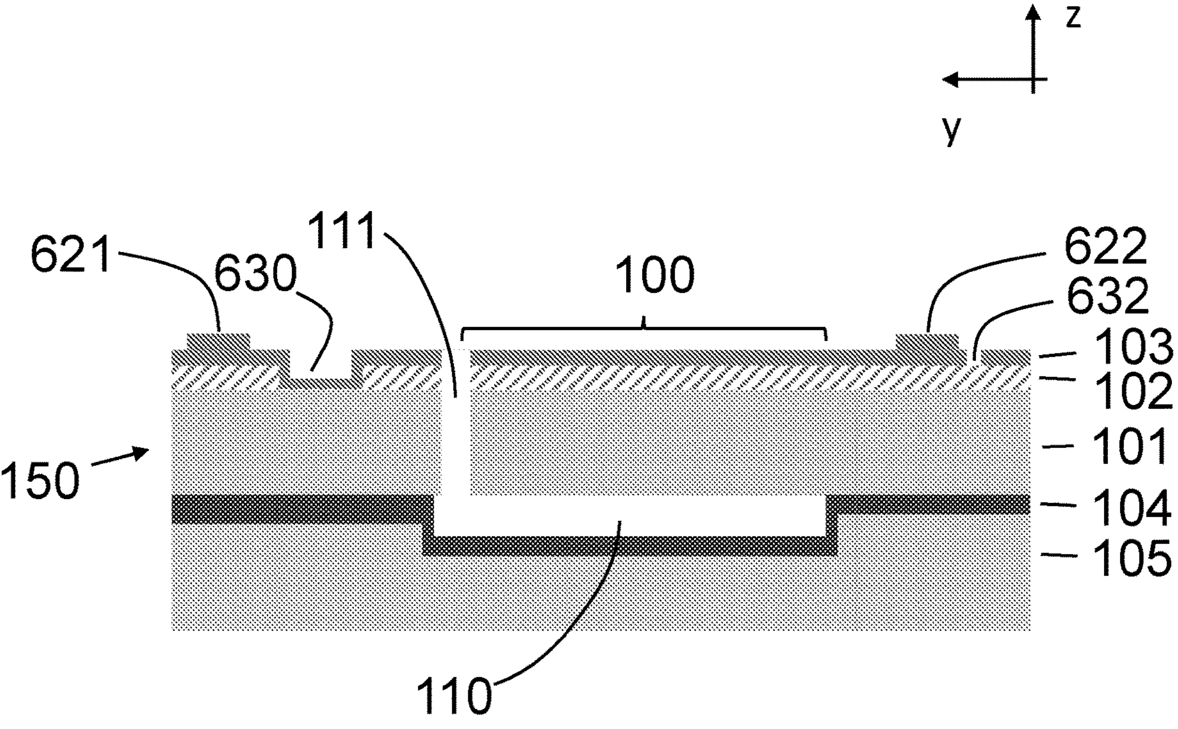

Another embodiment of a temperature-stable MEMS resonator 150 according to the invention is illustrated in FIGS. 14A-B. The resonator is a flexural-mode resonator which vibrates in an out-of-plane mode. As illustrated in FIG. 14A, a vertical trench 111 through the material layers 101, 102, and 103 defines the lateral dimensions of the beam-shaped resonator element 100 which vibrates in a resonance mode with the predominant motion perpendicular to plane of the material layers 101, 102, and 103 (i.e., along z direction, out-of-plane). In some embodiments, to minimize the variation of the resonance frequency with temperature, the longitudinal axis of the beam-shaped resonator element 100 (the y direction) is aligned substantially along a <100> crystalline axis of the single-crystalline silicon within the device layer 101.

FIG. 14B illustrate further features of the resonator of FIG. 14A along the cross-section AA' along the y direction. A contact pad 621 is provided for making an electrical connection to the doped single-crystalline silicon layer 101 which is used in this embodiment as the bottom electrode layer. An opening 630 in the piezoelectric layer 102 is formed to provide a pathway for an electrical interconnect through the piezoelectric layer 102. A contact pad 622 is provided for making an electrical connection to the top electrode layer 103. The top electrode is removed in some areas 632 to create galvanic isolation between the two electrodes.

Figure 15A:
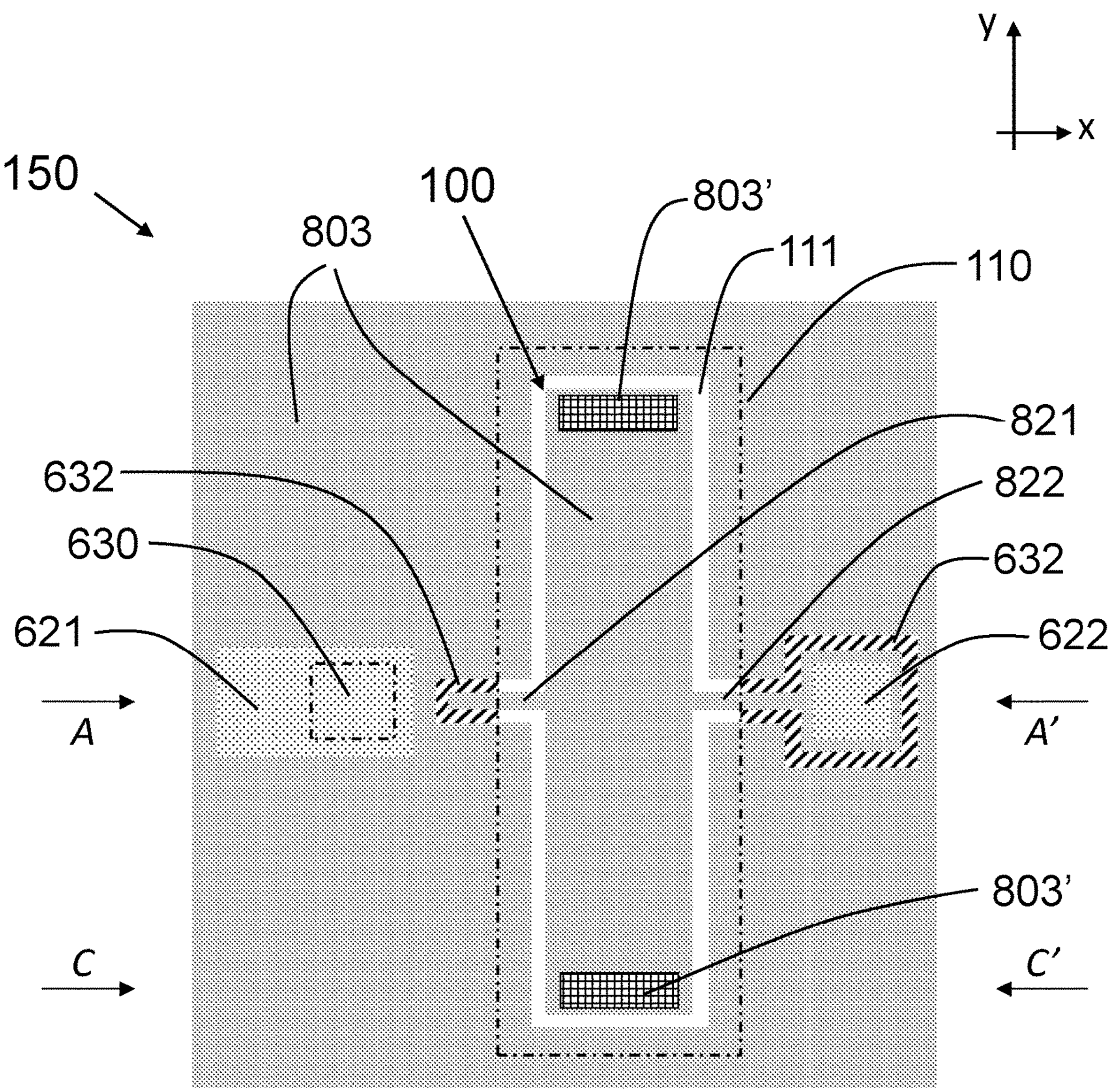
FIGS. 15A-15C show further embodiments of the MEMS resonator in accordance with certain embodiments.
Figures 15B, 15C:
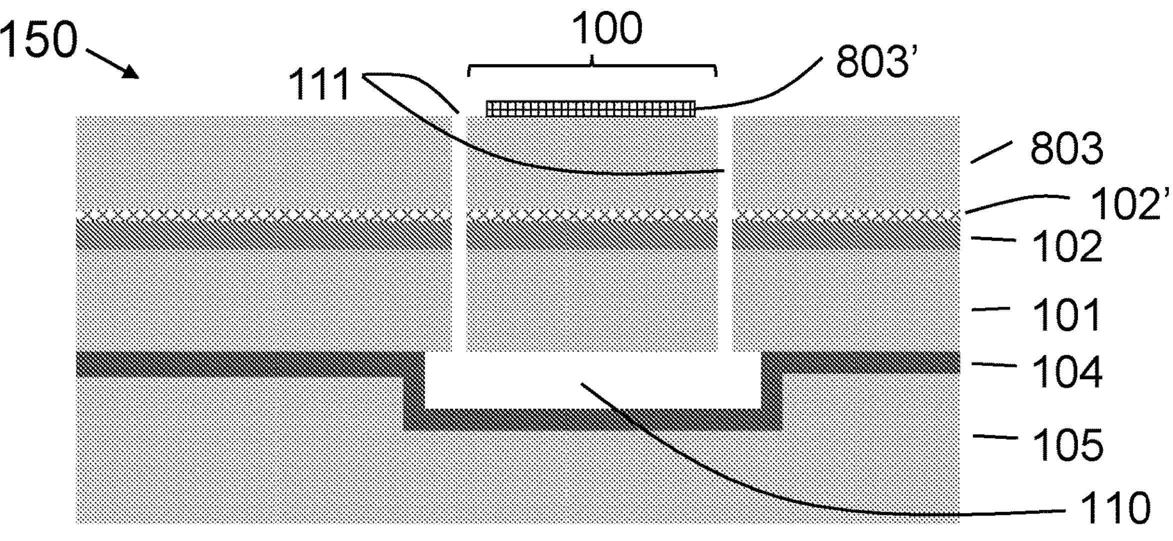

Another embodiment of a temperature-stable MEMS resonator 150 according to the invention is illustrated in FIGS. 15A-C. This resonator comprises two single-crystalline layers 101 and 803 which are both doped with phosphorus atoms with a concentration distribution according to the preceding embodiment(s). In preferable embodiments, the phosphorus doping concentration in at least one of the single-crystalline silicon layers, 101 or 803, has a concentration profile according to one of the above specified preferable concentration ranges at the positions $d_{REL}$=0.1 and $d_{REL}$=0.9 within the silicon layer. In more preferable embodiments, phosphorus doping concentrations in both single-crystalline silicon layers 101 and 803 at the positions $d_{REL}$=0.1 and $d_{REL}$=0.9 (within both respective layers) are according to one of the above specified preferable concentration ranges. The doped silicon layer 101 may be used as the bottom electrode layer and the doped silicon layer 803 may be used as the top electrode. In certain embodiments, the thickness of the layer 803 is in the range from 2 μm to 20 μm. In certain embodiments, phosphorus-doped single-crystalline silicon (i.e., the layers 101 and 803 together) forms more than 50% of the mass of the resonator element 100. The methods used for doping the layers 101 and 803 include doping of a CSOI or SOI starting wafer (as discussed in the context of FIGS. 2A-C and FIGS. 5A-F above), doping before bonding (as discussed in the context of FIG. 7A-D above), and double-sided doping (as discussed in the context of FIG. 10 above).

The cross-section AA' of the resonator of FIG. 15A is illustrated in FIG. 15C, and the cross-section CC' of the resonator of FIG. 15A is illustrated in FIG. 15B. In some embodiments, as illustrated in FIGS. 15B and 15C, an intermediate material layer 102' between the piezoelectric layer 102 and silicon layer 803 is provided. The layer 102' may be used to bond the silicon layer 803 to the piezoelectric layer 102. In some embodiments, there is a material layer 803' on the resonator element (a pattern as illustrated in FIGS. 15A and 15B or a uniform layer) which can be used for example for finetuning the resonance frequency of the resonator. The thickness of the material layer 803' may be in the range from 0.1 μm to 0.4 μm.

In the embodiment illustrated in FIG. 15A, the layout of the resonator element 100 corresponds to that of a length-extensional mode resonator. A vertical trench 111 through the material layers (101, 102, 102', and 803) defines the lateral dimensions of the resonator element 100 which vibrates in a resonance mode with the predominant motion along the elongated axis of the resonator element 100 (along y direction). The resonator element 100 is tethered using suspension elements (821, 822) fixed to the resonator element 100 at nodal positions of the length-extensional resonance mode (and fixed to respective support structure(s) at their other end).

FIG. 15C illustrates further features of the resonator in the cross-section AA' along the x direction. A contact pad 621 is provided for making an electrical connection to the doped single-crystalline silicon layer 101 which is used in this embodiment as the bottom electrode layer. An opening 630 through the piezoelectric layer 102, the intermediate layer 102', and the top electrode layer 803 is formed to provide a pathway to the bottom electrode 101. A contact pad 622 is provided for making an electrical connection to the top electrode layer 803. Patterned in the top electrode (single-crystalline silicon) layer 803 are trenches 632 extending all the way to the intermediate layer 102' to provide a galvanic isolation between the electrical (inter) connections. (In the embodiment illustrated in FIG. 15C, it is assumed that the intermediate layer 102' is electrically insulating.)

In some embodiments, to minimize the variation of the resonance frequency with temperature, the crystalline directions in the single-crystalline silicon layers 101 and 803 and the layout of the resonator element 100 are such that a <100> crystalline axis of the single-crystalline silicon within the (bottom) silicon layer 101, a <100> crystalline axis of the single-crystalline silicon within the (top) silicon layer 803, and the longitudinal axis of the resonator element 100 (the y direction and the direction of the elongated material portion of the resonator element) are all aligned substantially parallel to each other.

Without limiting the scope and interpretation of the patent claims, certain technical effects of one or more of the example embodiments disclosed herein are listed in the following. A technical effect is a low temperature variation of the resonance frequency (i.e., good thermal stability) of the silicon MEMS resonator. A further technical effect is that the phosphorus doping profile is achieved at a relatively low annealing temperature using an annealing time suitable for cost-effective mass production.

The foregoing description has provided by way of non-limiting examples of particular implementations and embodiments of the invention a full and informative description of the best mode presently contemplated by the inventors for carrying out the invention. It is however clear to a person skilled in the art that the invention is not restricted to details of the embodiments presented above, but that it can be implemented in other embodiments using equivalent means without deviating from the characteristics of the invention.

Furthermore, some of the features of the above-disclosed embodiments of this invention may be used to advantage without the corresponding use of other features. As such, the foregoing description should be considered as merely illustrative of the principles of the present invention, and not in limitation thereof. Hence, the scope of the invention is only restricted by the appended patent claims.

The invention claimed is:

1. A MEMS, microelectromechanical system, resonator comprising:

a substrate;

a resonator element; and a cavity, wherein the resonator element is separated from the substrate by said cavity, and wherein the resonator element comprises a layer of single-crystalline silicon, wherein the layer of single-crystalline silicon is doped with phosphorus atoms where the concentration $n_{dop}$ of the phosphorus atoms is:

(i) within the range from $1.99\times10^{20}$ $cm^{-3}$ to $2.97\times10^{20}$ $cm^{-3}$ at $d/t_{DEV}=0.1$ and within the range from $1.20\times10^{20}$ $cm^{-3}$ to $1.78\times10^{20}$ $cm^{-3}$ at $d/t_{DEV}=0.9$ or (ii) within the range from $1.20\times10^{20}$ $cm^{-3}$ to $1.80\times10^{20}$ $cm^{-3}$ at $d/t_{DEV}=0.1$ and within the range from $2.02\times10^{20}$ $cm^{-3}$ to $2.97\times10^{20}$ $cm^{-3}$ at $d/t_{DEV}=0.9$ or (iii) within the range from $2.08\times10^{20}$ $cm^{-3}$ to $2.97\times10^{20}$ $cm^{-3}$ at $d/t_{DEV}=0.1$, within the range from $1.20\times10^{20}$ $cm^{-3}$ to $1.86\times10^{20}$ $cm^{-3}$ at $d/t_{DEV}=0.5$, and within the range from $2.08\times10^{20}$ $cm^{-3}$ to $2.97\times10^{20}$ $cm^{-3}$ at $d/t_{DEV}=0.9$ where d is the distance between a position within the layer of single-crystalline silicon and the top surface of the layer of single-crystalline silicon and $t_{DEV}$ is the thickness of the layer of single-crystalline silicon, wherein the layer of single-crystalline silicon forms more than 50% of the resonator element by mass.

2. The MEMS resonator according to claim 1, wherein the MEMS resonator further comprises a layer of piezoelectric material for exciting the resonator element to a resonance mode.

3. The MEMS resonator according to claim 2, wherein the thickness of the layer of piezoelectric material is within the range from 1 μm to 2 μm.

4. The MEMS resonator according to claim 1, wherein the thickness of the layer of single-crystalline silicon is within the range from 9 μm to 17 μm.

5. The MEMS resonator according to claim 1, wherein the MEMS resonator resonates at a resonance frequency with a variation within ±30 parts per million in the temperature range from −30° C. to 85° C. with respect to the resonance frequency measured at 25° C.

6. The MEMS resonator according to claim 1, wherein the MEMSresonator element comprises an elongated material portion which is parallel within standard manufacturing tolerances with a <100> crystalline axis of the layer of single-crystalline silicon.

7. The MEMS resonator according to claim 1, wherein the resonator element comprises an elongated material portion which is configured to resonate in a length-extensional resonance mode or in a flexural resonance mode.

8. The MEMS resonator according to claim 1, wherein the concentration $n_{dop}$ of the phosphorus atoms is:

(i) within the range from $2.10\times10^{20}$ $cm^{-3}$ to $2.86\times10^{20}$ $cm^{-3}$ at $d/t_{DEV}$=0.1 and within the range from $1.26\times10^{20}$ $cm^{-3}$ to $1.72\times10^{20}$ $cm^{-3}$ at $d/t_{DEV}$=0.9 or (ii) within the range from $1.26\times10^{20}$ $cm^{-3}$ to $1.73\times10^{20}$ $cm^{-3}$ at $d/t_{DEV}$=0.1 and within the range from $2.10\times10^{20}$ $cm^{-3}$ to $2.86\times10^{20}$ $cm^{-3}$ at $d/t_{DEV}$=0.9 or (iii) within the range from $2.17\times10^{20}$ $cm^{-3}$ to $2.86\times10^{20}$ $cm^{-3}$ at $d/t_{DEV}$=0.1, within the range from $1.27\times10^{20}$ $cm^{-3}$ to $1.77\times10^{20}$ $cm^{-3}$ at $d/t_{DEV}$=0.5, and within the range from $2.17\times10^{20}$ $cm^{-3}$ to $2.86\times10^{20}$ $cm^{-3}$ at $d/t_{DEV}$=0.9.

9. The MEMS resonator according to claim 1, wherein the concentration $n_{dop}$ of the phosphorus atoms is:

(i) within the range from $2.14\times10^{20}$ $cm^{-3}$ to $2.75\times10^{20}$ $cm^{-3}$ at $d/t_{DEV}$=0.1 and within the range from $1.28\times10^{20}$ $cm^{-3}$ to $1.70\times10^{20}$ $cm^{-3}$ at $d/t_{DEV}$=0.9 or (ii) within the range from $1.28\times10^{20}$ $cm^{-3}$ to $1.71\times10^{20}$ $cm^{-3}$ at $d/t_{DEV}$=0.1 and within the range from $2.14\times10^{20}$ $cm^{-3}$ to $2.75\times10^{20}$ $cm^{-3}$ at $d/t_{DEV}$=0.9 or (iii) within the range from $2.18\times10^{20}$ $cm^{-3}$ to $2.75\times10^{20}$ $cm^{-3}$ at $d/t_{DEV}$=0.1, within the range from $1.28\times10^{20}$ $cm^{-3}$ to $1.75\times10^{20}$ $cm^{-3}$ at $d/t_{DEV}$=0.5, and within the range from $2.18\times10^{20}$ $cm^{-3}$ to $2.75\times10^{20}$ $cm^{-3}$ at $d/t_{DEV}$=0.9.

10. The MEMS resonator according to claim 1, wherein the resonator element comprises two layers of single-crystalline silicon.

11. The MEMS resonator according to claim 1, wherein the resonator element comprises two layers of single-crystalline silicon, and one of the two layers of single-crystalline silicon is doped with phosphorus atoms in accordance with one of the options (i), (ii), or (iii) and the other of the two layers of single-crystalline silicon is doped with phosphorus atoms in accordance with one of the options (i), (ii), or (iii).

12. The MEMS resonator according to claim 1, wherein the resonator element is free from precipitation of compounds comprising silicon and phosphorus.

13. The MEMS resonator according to claim 1, wherein the layer of single-crystalline silicon is doped with phosphorus atoms using thermal diffusion doping.

14. The MEMS resonator according to claim 1, wherein the concentration $n_{dop}$ of the phosphorus atoms has a local maximum concentration at $d/t_{DEV}$ in the range from 0.85 to 0.95.

15. The MEMS resonator according to claim 1, wherein the resonator element comprises two layers of single-crystalline silicon, wherein a <100> crystalline axis of a first of the two layers of single-crystalline silicon and a <100> crystalline axis of the second of the two layers of single-crystalline silicon are aligned parallel within standard manufacturing tolerances to each other within the respective planes of the two layers.

16. A method of manufacturing the MEMS resonator of claim 1, comprising:

taking a starting wafer substrate;

performing process steps to manufacture the resonator element and said cavity, wherein the layer of single-crystalline silicon is doped using thermal diffusion doping.

17. A wafer comprising one or more MEMS resonators, wherein each MEMS resonator comprises:

a substrate;

a resonator element; and a cavity, wherein the resonator element is separated from the substrate by said cavity, and wherein the resonator element comprises a layer of single-crystalline silicon, wherein the layer of single-crystalline silicon is doped with phosphorus atoms where the concentration $n_{dop}$ of the phosphorus atoms is (i) within the range from $1.99\times10^{20}$ $cm^{-3}$ to $2.97\times10^{20}$ $cm^{-3}$ at $d/t_{DEV}$=0.1 and within the range from $1.20\times10^{20}$ $cm^{-3}$ to $1.78\times10^{20}$ $cm^{-3}$ at $d/t_{DEV}$=0.9 or (ii) within the range from $1.20\times10^{20}$ $cm^{-3}$ to $1.80\times10^{20}$ $cm^{-3}$ at $d/t_{DEV}$=0.1 and within the range from $2.02\times10^{20}$ $cm^{-3}$ to $2.97\times10^{20}$ $cm^{-3}$ at $d/t_{DEV}$=0.9 or (iii) within the range from $2.08\times10^{20}$ $cm^{-3}$ to $2.97\times10^{20}$ $cm^{-3}$ at $d/t_{DEV}$=0.1, within the range from $1.20\times10^{20}$ $cm^{-3}$ to $1.86\times10^{20}$ $cm^{-3}$ at $d/t_{DEV}$=0.5, and within the range from $2.08\times10^{20}$ $cm^{-3}$ to $2.97\times10^{20}$ $cm^{-3}$ at $d/t_{DEV}$=0.9 where d is the distance between a position within the layer of single-crystalline silicon and the top surface of the layer of single-crystalline silicon and $t_{DEV}$ is the thickness of the layer of single-crystalline silicon, wherein the layer of single-crystalline silicon forms more than 50% of the resonator element by mass.

* * * * *